(12) United States Patent
Shirakawa et al.

(10) Patent No.: US 6,191,394 B1
(45) Date of Patent: Feb. 20, 2001

(54) HEAT TREATING APPARATUS

(75) Inventors: Eiichi Shirakawa; Nobuyuki Sata, both of Kumamoto (JP)

(73) Assignee: Tokyo Electron Ltd. (JP)

( * ) Notice: Under 35 U.S.C. 154(b), the term of this patent shall be extended for 0 days.

(21) Appl. No.: 09/314,138

(22) Filed: May 19, 1999

(51) Int. Cl.[7] .............................. H05B 3/68; C23C 16/00
(52) U.S. Cl. ........................................ 219/444.1; 118/724
(58) Field of Search ............................ 219/444.1, 446.1, 219/448.11; 118/724, 725

(56) References Cited

U.S. PATENT DOCUMENTS

| 5,225,663 | * | 7/1993 | Matsumura et al. | 219/444.1 |
| 5,635,093 | * | 6/1997 | Arena et al. | 219/444.1 |
| 5,702,624 | * | 12/1997 | Liao et al. | 219/444.1 |
| 5,854,468 | * | 12/1998 | Muka | 219/444.1 |
| 5,927,077 | * | 7/1999 | Hisai et al. | 219/444.1 |
| 6,121,579 | * | 12/1997 | Aoki et al. | 219/444.1 |

FOREIGN PATENT DOCUMENTS

| 3-2912 | 1/1991 | (JP) . |
| 3-169367 | 7/1991 | (JP) . |

* cited by examiner

Primary Examiner—Sang Paik
(74) Attorney, Agent, or Firm—Rader, Fishman & Grauer

(57) ABSTRACT

A heat treating apparatus comprises a hot plate having a top surface on which is placed a substrate that is to be subjected to a heat treatment, setting means for setting an original target temperature of the hot plate required for subjecting the substrate to a heat treatment, a heat energy supply source for supplying a heat energy to the hot plate, a sensor for detecting the temperature of the hot plate, and control means receiving a detection signal from the sensor to obtain a difference in the detected temperature of the hot plate between the state that the substrate is not placed on the hot plate and the state that the substrate is placed on the hot plate, the original target temperature being switched based on the difference, and a signal denoting the switched target temperature in place of the original target temperature being supplied from the control means to the heat energy supply source.

35 Claims, 20 Drawing Sheets

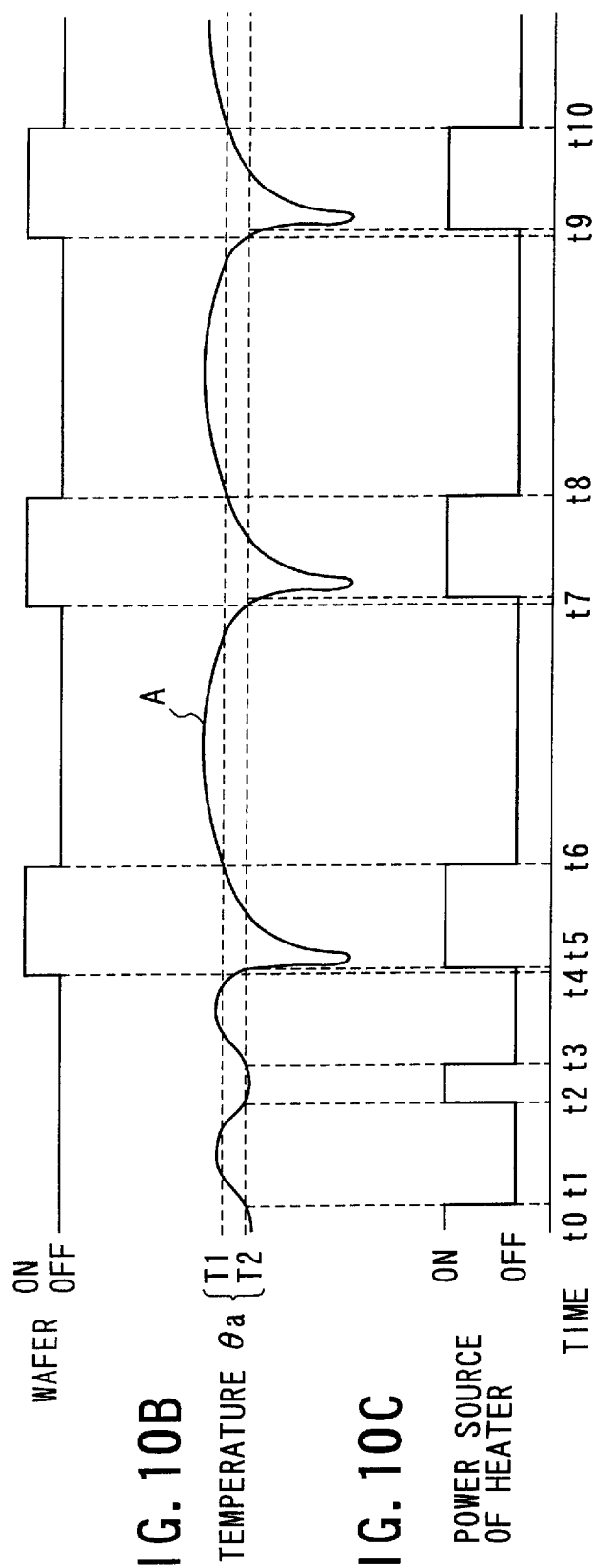

$$u = Kpe + Ki\int edt + Kd\frac{de}{dt} + u0$$

$$Ki = \frac{1}{Ti}$$

$$Kd = Td$$

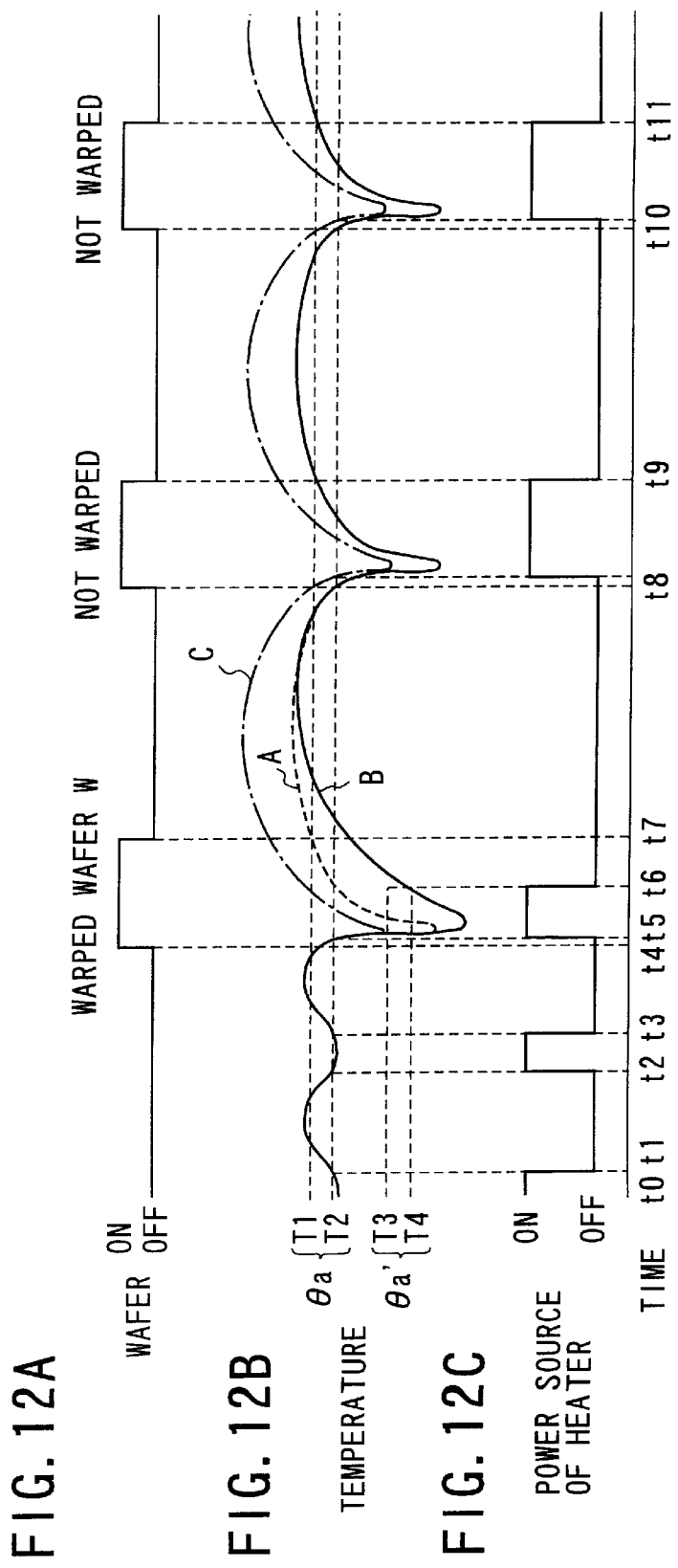

HEAT TREATING APPARATUS

BACKGROUND OF THE INVENTION

The present invention relates to a heat treating apparatus including a heating apparatus and a cooling apparatus incorporated in a semiconductor manufacturing system for manufacturing a semiconductor device.

In a photolithography process for manufacturing a semiconductor device, a semiconductor wafer is repeatedly heated and cooled. In the apparatus disclosed in, for example, U.S. Pat. No. 5,664,254, a wafer is heated in an adhesion unit and a vapor of hexamethyl disilazane (HMDS) is allowed to act on the wafer surface. Also, the wafer is heated in a pre-baking unit for stabilizing a photoresist coating film. The wafer is also heated in a post-baking unit for baking (PEB) the photoresist film after light exposure in a predetermined pattern. On the other hand, the wafer heated in the pre-baking step and the PEB step is cooled in a cooling unit to about room temperature in a predetermined time.

In these heat treatments, it is important to control the temperatures of the wafer, the hot plate and the cooling plate. However, it is very difficult to control accurately the actual temperature of the wafer during the heat treatment. For example, it is proposed to measure the surface temperature of the wafer by using an infrared ray observing apparatus or a temperature sensor. However, any of these proposed methods is low in accuracy and, thus, has not yet been put to practical use.

Some of a large number of wafers are deformed and warped. If a warped wafer W is disposed on a hot plate, only a small portion of the wafer W is brought into contact with a hot plate 58, as shown in FIG. 11A, leading to a small contact area between the hot plate 58 and the wafer W. Since the heat exchange efficiency between the warped wafer W shown in FIG. 11A and the hot plate 58 is lower than that between the wafer W that is not warped as shown in FIG. 9A and the hot plate 58, the warped wafer W takes a longer time for the heating by the hot plate 58 to a predetermined temperature.

On the other hand, the temperature of the hot plate 58 is detected by a sensor buried in the hot plate 58. Therefore, if the amount of heat released from the hot plate 58 into the wafer W is small, the electric energy required for maintaining the hot plate 58 at a target temperature is also small, resulting in a short time for the power supply to the heater. Where the warping of the wafer is small, the fluctuation in the heat amount supplied to the hot plate 58, which is derived from the warping of the wafer W, can be compensated by the heat capacity owned by the hot plate 58 itself.

However, where the wafer W is warped greatly, the temperature of the hot plate 58 is excessively lowered, compared with the case where the wafer W is not warped. In such a case, it is possible for the actual temperature of the hot plate 58 not to be elevated to reach a target temperature before the succeeding wafer W is disposed on the hot plate after removal of the heat-treated wafer W from the hot plate 58. Incidentally, the treating time for one cycle of the heat-treating step in the photolithography process is said to be 90 seconds or less. If the succeeding wafer W is subjected to a heat treatment under the state that the actual temperature of the hot plate 58 is not elevated to a target temperature within a predetermined time, the wafer W is likely to become defective.

In the conventional heat treatment apparatus, the heater of the hot plate 58 is turned on or off depending on the temperature of the hot plate 58. To be more specific, the power source of the heater is turned on or off or the power supply amount is increased or decreased depending on the condition as to whether or not the temperature of the hot plate detected by the sensor has reached a predetermined temperature. Therefore, power is supplied uniformly to the hot plate 58 in the conventional apparatus regardless of the presence or absence of the wafer W on the hot plate 58.

However, the hot plate 58 having the wafer W disposed thereon has a large heat capacity, compared with the hot plate 58 having the wafer W not disposed thereon and, thus, exhibits a low rate of the temperature elevation, with the result that a long time is required for heating the hot plate 58 to a target temperature such that the heating time possibly exceeds the processing time (90 seconds or less) for one cycle of the heat treating step included in the photolithography process.

It should also be noted that, if the heating time to a target temperature is unduly long, the wafers W are rendered nonuniform in the time during which the wafers W are actually subjected to a heat treatment, even if the wafers W are kept disposed on the hot plate 50 for the same time. It follows that the treated wafers W are rendered nonuniform in properties.

For example, if the wafer W is disposed on the hot plate 58 at time t4 as shown in FIG. 10A, the heat energy is transferred from the hot plate 58 to the wafer W, resulting in a rapid temperature drop of the hot plate 58. As apparent from curve A shown in FIG. 10B, the temperature of the hot plate 58 at time t5 immediately after time t4 is made lower than an allowable lower limit T2 (° C.) of a target temperature θa. The heater power source is turned on at time t5 so as to start heating of the hot plate 58. However, it takes time for the temperature of the hot plate 58 to be elevated to fall within an allowable range T1 to T2(° C.) of the target temperature θa, as shown in FIG. 10C. Naturally, the time during which the wafer W is actually subjected to a heat treatment is shorter than the time during which the wafer W is disposed on the hot plate 58. Since it is very difficult to control the time during which the wafer W is actually subjected to a heat treatment, the treated wafers W differ from each other in the actual heat treating time, giving rise to a non-uniform heat treatment.

The actual temperature of the hot plate 58 is not necessarily equal to the temperature detected by a temperature sensor. For example, it is possible for the temperature detected by the temperature sensor to be 19° C., though the actual temperature of the hot plate 58 is 20° C. The difference between the actual temperature and the temperature detected by the temperature sensor is called herein offset. The offset is caused by a complex factor involving a deviation derived from the characteristics themselves of the temperature sensor and a deviation that is brought about when a temperature detection signal is transmitted through an analog circuit or an amplifier.

Where there is an offset, the analog circuit or the amplifier are electrically adjusted to set forth seemingly that there is no offset. For example, where the temperature sensor has detected a temperature of 19° C., the actual temperature of the hot plate 58 is handled as 20° C. so as to display 20° C. on a monitor screen. Where the offset is constant, it is possible to electrically adjust the analog circuit or the amplifier to set forth seemingly that there is no offset even where there is an offset.

However, the offset value varies with time in some cases. Suppose, for example, that a coating unit installed in a user's factory is operated by way of trial to confirm that there is an offset of 1° C. between the actual temperature (20° C.) of the hot plate and the temperature (19° C.) detected by the temperature sensor, and that the unit is adjusted to eliminate seemingly the offset. In this case, the offset value of 1° C. is maintained in the initial period of operation of the coating unit such that 20° C. is displayed on the monitor screen. However, a temperature of 19° C. lower than the set temperature (20° C.) of the hot plate comes to be displayed on the monitor screen 6 months to one year after the start-up of the coating unit operation. In this case, the actual temperature has been found to be 20° C. when examined in detail by using a high precision temperature measuring apparatus.

The deviation of the displayed temperature from the actual temperature of the hot plate is caused by two factors. A first factor is an increased offset derived from deterioration with time of the temperature sensor. A second factor, which is irrelevant to the temperature sensor, is a change in the characteristics of the analog circuit or the amplifiers or a change in the characteristics of the heat circulation system of the hot plate. For eliminating the first factor, the temperature sensor must be renewed. The second factor can be dealt with by an electric adjustment. However, the unit operation must be stopped completely for finding the cause of the offset, leading to reduction in the working ratio of the unit.

BRIEF SUMMARY OF THE INVENTION

An object of the present invention is to provide a heat treating apparatus that permits detecting the temperature deviation of a hot plate, specifying the cause thereof, and changing the process conditions to conform with the state of the substrate, with the apparatus kept operated.

According to a first aspect of the present invention, there is provided a heat treating apparatus, comprising:

a hot plate having a top surface on which is placed a substrate that is to be subjected to a heat treatment;

setting means for setting an original target temperature of the hot plate required for subjecting the substrate to a heat treatment;

a heat energy supply source for supplying a heat energy to the hot plate;

temperature detecting means for detecting the temperature of the hot plate; and control means receiving a detection signal from the temperature detecting means to obtain a difference in the detected temperature of the hot plate between the state that the substrate is not disposed on the hot plate and the state that the substrate is disposed on the hot plate, the original target temperature being switched based on the difference, and a signal denoting the switched target temperature in place of the original target temperature being supplied from the control means to the heat energy supply source.

According to a second aspect of the present invention, there is provided a heat treating apparatus, comprising:

a hot plate having a top surface on which is placed a substrate that is to be subjected to a heat treatment;

setting means for setting an original target temperature of the hot plate required for subjecting the substrate to a heat treatment;

a heat energy supply means for supplying a heat energy to the hot plate;

warping deformation detecting means for detecting the warping deformation of the substrate on the hot plate; and control means receiving a detection signal from the warping deformation detecting means, the original target temperature being switched based on the detection signal, and a signal denoting the switched target temperature in place of the original target temperature being supplied from the control means to the heat energy supply source.

In this embodiment, it is judged whether the substrate now placed on the hot plate is abnormal or normal. Where the substrate is judged to be abnormal, the original target temperature θa is switched to another target temperature θa' so as to perform an optimum control of the temperature of the hot plate in accordance with the state of the substrate placed thereon.

According to a third aspect of the present invention, there is provided a heat treating apparatus, comprising:

a hot plate having a top surface on which is placed a substrate that is to be subjected to a heat treatment;

setting means for setting an original target temperature of the hot plate required for subjecting the substrate to a heat treatment and an allowable range of the original target temperature;

a heat energy source for supplying a heat energy to the hot plate;

temperature detecting means for detecting the temperature of the hot plate;

temperature control means receiving a detection signal from the temperature detecting means and controlling the heat energy supply means based on the detection signal so as to maintain the temperature of the hot plate within an allowable range of the original target temperature;

transfer means for transferring substrates one by one onto the hot plate; and cooling mechanism for forcedly cooling the hot plate during the period between removal of the heat-treated substrate from the hot plate and placement of the succeeding substrate on the hot plate.

In the heat treating apparatus according to the third aspect of the present invention, the hot plate on which the substrate is not placed is forcedly cooled by a forcedly cooling mechanism so as to intentionally increase the heat supply rate to the hot plate. As a result, the temperature of the hot plate that has been lowered after placement of the substrate can be promptly restored to the target temperature. A nozzle for blowing a gas for physically cooling the hot plate can be used as a forcedly cooling mechanism. In addition, a dummy signal transmitter for imaginarily cooling the hot plate can also be used as a forcedly cooling mechanism. If a dummy signal is transmitted from the dummy signal transmitter to the temperature control means, the temperature control means recognizes the dummy signal as a disturbance w so as to increase the deviation e. As a result, the operation amount u is increased so as to increase the power supply rate to the heater (see FIG. 13). It follows that the temperature of the hot plate that was lowered after placement of the substrate is promptly restored to the target temperature θa.

According to a fourth aspect of the present invention, there is provided a heat treating apparatus, comprising:

a hot plate having a top surface on which is placed a substrate that is to be subjected to a heat treatment;

a heater arranged in the hot plate;

a temperature sensor arranged in the hot plate;

an interrupter for turning the heater on or off based on the temperature detected by the temperature sensor;

a transfer mechanism for transferring substrates one by one onto the hot plate;

a nozzle having a spurting port facing the temperature sensor;

a gas supply mechanism for supplying a gas to the nozzle; and control means for operating the gas supply means during the period between removal of the heat-treated substrate from the hot plate and placement of the succeeding substrate on the hot plate so as to permit a gas to be spurted from the nozzle toward the temperature sensor.

According to a fifth aspect of the present invention, there is provided a heat treating apparatus, comprising:

a hot plate having a top surface on which is placed a substrate that is to be subjected to a heat treatment;

a heater arranged in the hot plate;

a temperature sensor arranged in the hot plate;

setting means for setting a target temperature of the hot plate required for subjecting the substrate to a heat treatment;

control means for obtaining a difference between the temperature detected by the temperature sensor and the target temperature and for controlling the temperature of the hot plate by adjusting the heater to eliminate the difference;

memory means for storing the detected temperature and the thermal environment of the hot plate during the normal operation; and means for reading the thermal environment from the memory means when a temperature deviation has taken place between the target temperature and the detected temperature, for reproducing the thermal environment, and for specifying the degree of the temperature deviation and the point where the temperature deviation has taken place based on the reproduced thermal environment and the detected temperature of the hot plate during the normal operation.

According to a sixth aspect of the present invention, there is provided a heat treating apparatus, comprising:

a hot plate having a top surface on which is placed a substrate that is to be subjected to a heat treatment;

a heater arranged in the hot plate;

a power supply mechanism for supplying an electric power to the heater;

a gas supply mechanism for supplying a gas from sideways of the hot plate toward the hot plate;

a temperature sensor for detecting the temperature of the hot plate;

setting means for setting a target temperature of the hot plate required for subjecting the substrate to a heat treatment;

control means for obtaining a difference between the temperature detected by the temperature sensor and the target temperature and for controlling the power supply mechanism to eliminate the difference;

memory means for storing the amount of an electric power supplied from the power supply mechanism to the hot plate during the normal operation, a gas flow rate supplied from the gas supply mechanism during the normal operation, and the temperature detected by the temperature sensor during the normal operation; and means for reading the power supply amount and the gas flow rate from the memory means when a temperature deviation has taken place between the target temperature and the detected temperature, for operating the power supply mechanism and the gas supply mechanism based on the power supply amount and the gas flow rate read out of the memory means and allowing the temperature sensor to detect the temperature of the hot plate, and for specifying the degree of the temperature deviation and the point where the temperature deviation has taken place based on the detected temperature and the temperature detected during the normal operation.

According to a seventh aspect of the present invention, there is provided a heat treating apparatus, comprising:

a hot plate having a top surface on which is placed a substrate that is to be subjected to a heat treatment;

a heater arranged in the hot plate;

a power supply mechanism for supplying an electric power to the heater;

a gas supply mechanism for supplying a gas from sideways of the hot plate toward the hot plate;

setting means for setting a target temperature of the hot plate required for subjecting the substrate to a heat treatment;

a first sensor for detecting the temperature of the hot plate, the detected temperature being converted into an electric signal;

an analog circuit for amplifying the electric signal;

control means for controlling the power supply rate of the power supply mechanism based on the amplified electric signal so as to set the temperature of the hot plate at the target temperature;

a second sensor for detecting the temperature of the hot plate at an accuracy higher than that in the first sensor;

memory means for storing the power supply rate from the power supply mechanism to the hot plate during the normal operation, the gas flow rate from the gas supply mechanism during the normal operation, the temperature detected by the first sensor during the normal operation, and the temperature detected by the second sensor during the normal operation; and means for reading the power supply rate and the gas flow rate out of the memory means when a temperature deviation has taken place between the target temperature and the temperature detected by the first sensor, for operating the power supply mechanism and the gas supply mechanism based on the power supply rate and the gas flow rate, respectively, read out of the memory means, and allowing the first and second sensors to detect the temperature of the hot plate at this stage, and for specifying the degree of the temperature deviation and the point where the temperature deviation has taken place based on the detected temperature and the temperature detected during the normal operation.

Further, according to an eighth aspect of the present invention, there is provided a heat treating apparatus, comprising:

a hot plate having a top surface on which is placed a substrate that is to be subjected to a heat treatment;

setting means for setting a target temperature of the hot plate required for subjecting the substrate to a heat treatment and an allowable range of the target temperature;

a heat energy supply source for supplying a heat energy to the hot plate;

a plurality of first temperature sensors for detecting the temperatures at a plurality of points on the top surface of the hot plate;

a plurality of second temperature sensors for detecting temperatures at a plurality of points above the hot plate;

memory means for storing the actual temperature of the substrate, the actual temperature of the top surface of the hot plate, and the temperature correlation data denoting the relationship with the temperature above the hot plate, at the time when a heat energy is supplied from the heat energy supply source to the hot plate;

estimating means for receiving detection signals from the first and second temperature sensors, for reading the temperature correlation data from the memory means, and for estimating the present temperature of the hot plate based on the temperature correlation data and the signals detected by the first and second temperature sensors; and control means for controlling the heat energy supply source based on the present temperature estimated by the estimating means.

In the present invention, it is desirable for the heat treating apparatus to comprise an upper cover arranged above the hot plate in a manner to face the top surface of the hot plate and for a plurality of temperature sensors to be mounted to the upper cover. The second temperature sensors may be arranged concentrically in the upper cover or may be arranged to form a lattice in the upper cover.

It is possible for the setting means to determine the target temperature based on a difference between the temperature detected by the first temperature sensors and the temperature detected by the second temperature sensors. It is also possible for the setting means to determine the target temperature based on a difference between the temperature detected by the first temperature sensors before the substrate is placed on the hot plate and the temperature detected by the first temperature sensors after the substrate is placed on the hot plate. Alternatively, it is possible for the setting means to determine the target temperature based on a difference between the temperature detected by the second temperature sensors before the substrate is placed on the hot plate and the temperature detected by the second temperature sensors after the substrate is placed on the hot plate. Further, it is possible for the setting means to set as the target temperature any of the temperature of the hot plate that permits maintaining the substrate free from warping at the target temperature and the temperature of the hot plate that permits the flat portion of the warped substrate at the target temperature.

In the present invention, the temperatures at a plurality of points on the top surface of the hot plate are detected both before and after the substrate is placed on the hot plate, and whether the substrate is warped or not is determined based on the difference between the temperatures detected before the substrate is mounted on the hot plate and the temperatures detected after the substrate is placed on the hot plate. Further, the target temperature is changed from the original target temperature θa to another target temperature θa' in accordance with the degree of warping of the substrate, and the temperature of the hot plate is controlled in accordance the changed target temperature θa'. It follows that a large number of products can be obtained even from a warped substrate, leading to a high yield and to a low manufacturing cost of the products.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10A is a timing chart showing the presence or absence of a wafer on a hot plate;

FIG. 10B shows the change in temperature of the hot plate;

FIG. 10C is a timing chart showing the on-off operation of a heater power source;

FIG. 12A is a timing chart showing the presence or absence of a wafer on a hot plate;

FIG. 12B shows the change in temperature of the hot plate;

FIG. 12C is a timing chart showing the on-off operation of a heater power source;

DETAILED DESCRIPTION OF THE INVENTION

Various preferred embodiments of the present invention will now be described with reference to the accompanying drawings.

Figure 1:
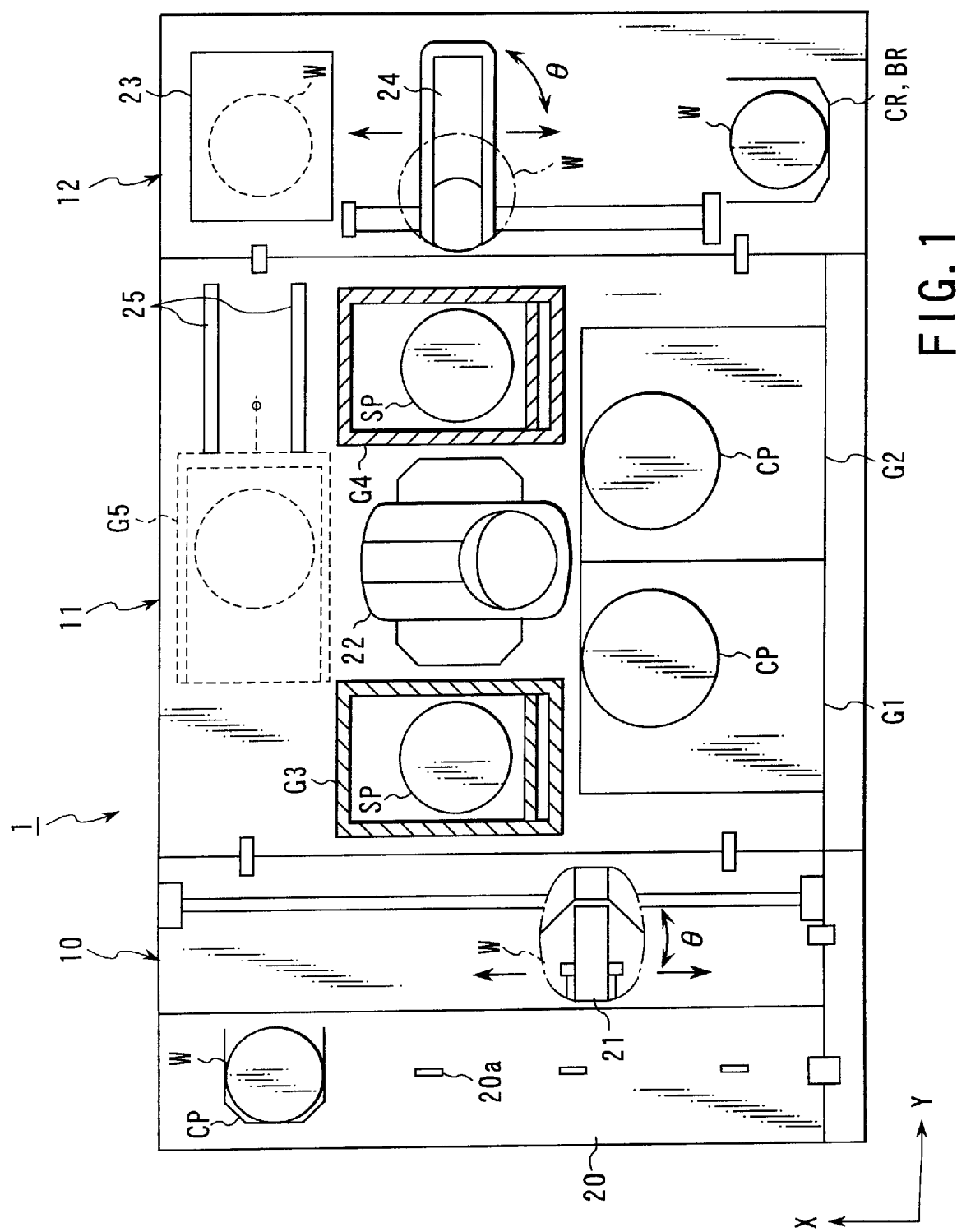
FIG. 1 is a plan view showing a coating-developing system.
Figure 2:
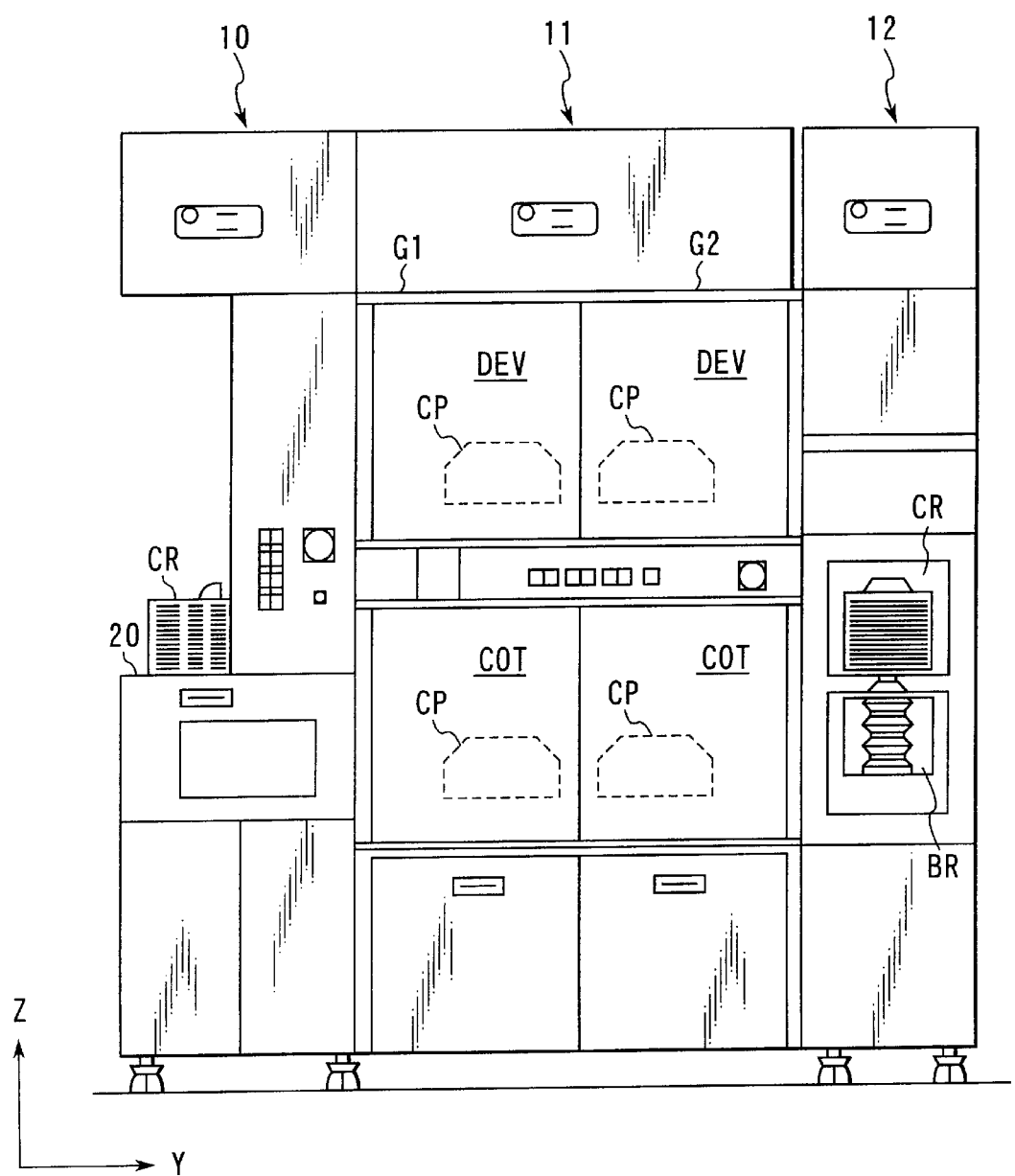
FIG. 2 is a front view showing the coating-developing system shown in FIG. 1.
Figure 3:
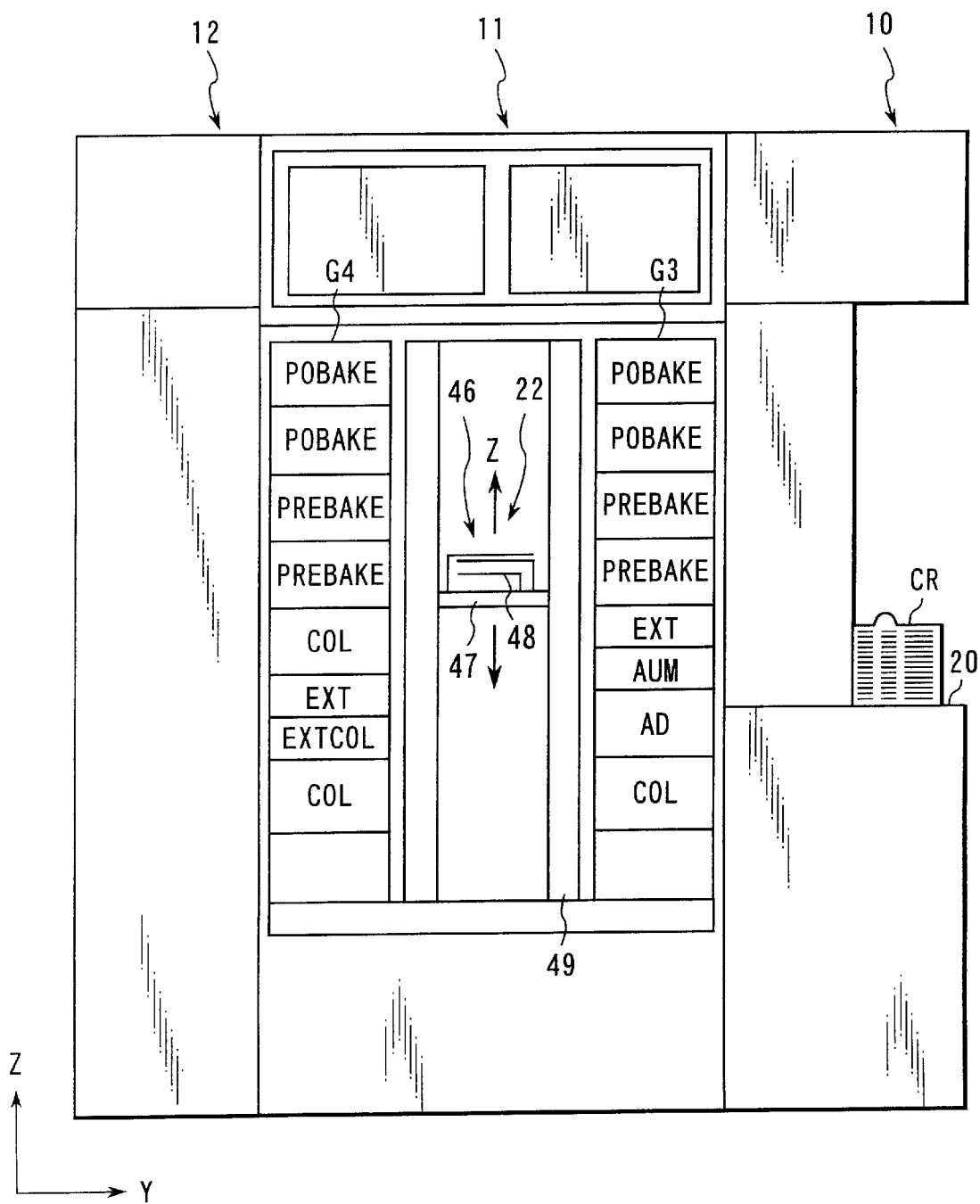
FIG. 3 is a back view showing the coating-developing system shown in FIG. 1.

As shown in FIGS. 1 to 3, a coating-developing system 1 comprises a cassette section 10, a process section 11 and an interface section 12.

A cassette table 20 and a first sub-transfer arm mechanism 21 are arranged in the cassette section 10. The cassette table 20 extends in an X-axis direction and includes four positioning members 20a. If a cassette CR is disposed on the table 20, the position of the cassette CR is determined by the positioning member 20a. Untreated wafers, i.e., wafers before treatment, are housed in two of the four cassettes CR, and treated wafers are housed in the remaining two cassettes CR.

The first sub-transfer arm mechanism 21 comprises an arm holder, a transfer base, a back-and-forth driving mechanism for moving the arm holder back and forth, an X-axis driving mechanism (not shown) for moving the transfer base in the X-axis direction, a Z-axis driving mechanism (not shown) for vertically moving the transfer base, and a θ-swing driving mechanism (not shown) for swinging the transfer base about the Z-axis. The arm holder is supported by the transfer base via a supporting shaft of the back-and-forth driving mechanism.

The process section 11 comprises five treating unit groups G1, G2, G3, G4, G5 and a main transfer arm mechanism 22 of a vertical transfer type. These five treating unit groups G1, G2, G3, G4, G5 are arranged to surround the main transfer arm mechanism 22. The fifth treating unit group G5 is arranged movable in a Y-axis direction along a rail 25. The main transfer arm mechanism 22 includes a plurality of arm holders 48, a transfer base 47, a back-and-forth driving mechanism of the arm holders, a vertical driving mechanism of the arm holders, and a swing driving mechanism of the arm holder. Each of the arm holders 48 is moved forward or backward by the back-and-forth driving mechanism of the arm holder. Also, the arm holders 48 are moved in the Z-axis direction together with the transfer base 47 by the vertical driving mechanism of the arm holder and are swung by an angle θ about the Z-axis together with the transfer base by the swing driving mechanism of the arm holder.

As shown in FIG. 2, the first and second treating unit groups G1 and G2 are arranged on the front side of the system 1. The first treating unit group G1 includes a resist coating unit (COT) and a developing unit (DEV). Likewise, the second treating group G2 includes a resist coating unit (COT) and a developing unit (DEV). In each of the first and second treating unit groups G1 and G2, the developing unit (DEV) is stacked on the resist coating unit (COT).

As shown in FIG. 3, the third and fourth treating units G3 and G4 are arranged on the back side of the system 1. The third treating unit group G3 includes cooling unit (COL), an adhesion unit (AD), an alignment unit (ALIM), an extension unit (EXT), a pre-baking unit (PREBAKE), and a post-baking unit (POBAKE), which are stacked one upon the other in the order mentioned such that the cooling unit (COL) constitutes the lowermost unit. The fourth treating unit group G5 includes a cooling unit (COL), an extension-cooling unit (EXTCOL), an extension unit (EXT), a cooling unit (COL), a pre-baking unit (PREBAKE), and a post-baking unit (POBAKE), which are stacked one upon the other in the order mentioned such that the cooling unit (COL) constitutes the lowermost unit. It should be noted that the cooling unit (COL) and the extension-cooling unit (EXTCOL) having a low treating temperature are arranged in lower stages, and the pre-baking unit (PEEBAKE), the post-baking unit (POBAKE) and the adhesion unit (AD) having a high treating temperature are arranged in upper stages. The particular arrangement is effective for eliminating the thermal mutual interference among the treating units. Incidentally, the fourth treating unit group G4 is arranged adjacent to the interface section 12. Further, a light exposure unit (not shown) is arranged adjacent to the interface section 12.

As shown in FIG. 11, a movable wafer cassette CR is stacked on a stationary buffer cassette BR on the front side of the interface section 12. On the other hand, a peripheral light exposure device 23 is arranged on the back side of the interface section 12. A second sub-transfer arm mechanism 24 is arranged in the interface section 12. The second sub-transfer arm mechanism 24 is substantially equal to the first sub-transfer arm mechanism 21. The second sub-transfer arm mechanism 24 serves to put wafers W into and take wafers W out of the cassettes CR and BR and to transfer wafers into the peripheral light exposure device 23.

A controller 120 shown in each of FIGS. 8, 14, 15 and 23 serves to control the operations of the main transfer arm mechanism 22 and the first and second sub-transfer arm mechanisms 21, 24 to permit the wafer W to be delivered among these arm mechanisms 21, 22 and 24. The controller 120 also serves to control the operations of the second sub-transfer arm mechanism 24 and the transfer device within the light exposure device so as to deliver the wafer between the two.

The heat treating units such as the pre-baking unit (PREBAKE), the post-baking unit (POBAKE), the cooling unit (COL) and extension-cooling unit (EXTCOL) will now be described with reference to FIGS. 4 and 5. Incidentally, a horizontal shielding plate 55 is omitted in FIG. 4, which is a plan view, to set forth the mechanisms positioned below the shielding plate 55 in FIG. 4.

The heat treating unit includes a process chamber 50 defined by side walls 52 and the horizontal shielding plate 55. Open portions 50A and 50B are formed on the front side (on the side of the main transfer arm mechanism 22) and the back side, respectively, of the process chamber 50. A circular opening 56 is formed in a central portion of the shielding plate 55, and a disc-like hot plate 58 on which a semiconductor wafer W is placed is arranged within the opening 56.

A plurality of holes 60, e.g., three holes 60, are formed in the hot plate 58. A support pin 62 is freely inserted through each of these holes 60. When the wafer W is loaded or unloaded, the support pin 62 is protruded from the surface of the hot plate 58 so as to perform delivery of the wafer W with the holder arm 48 of the main transfer arm mechanism 22.

An annular plate-like shutter 66 provided with a large number of through-holes 64 formed at an interval of, for example, 2° in the circumferential direction is arranged to surround the outer circumferential surface of the hot plate 58. In general, the shutter 66 is retreated in a position lower than the upper surface of the hot plate 58. In the heat treating step, however, the shutter 66 is moved upward to a position higher than the upper surface of the hot plate 58 so as to define an annular side wall between the hot plate 58 and a cover body 68, as shown in FIG. 5. As a result, the air and an inert gas such as a nitrogen gas blown from a gas supply system (not shown) to form a downstream is allowed to flow uniformly in the circumferential direction through the through-holes 64.

An exhaust port 68a for discharging the gas generated from the surface of the wafer W during the heat treatment is formed in a central portion of the cover body 68, and an exhaust pipe 70 is connected to the exhaust port 68a. The exhaust pipe 70 communicates with a duct 53 (or 54) on the front side (on the side of the main transfer arm mechanism 22) of the unit or with another duct (not shown).

A machine room 74 is defined below the shielding plate 55 by the shielding plate 55, the side walls 52 and a bottom plate 72. Arranged within the machine room 74 are a hot plate supporting plate 76, a shutter arm 78, a support pin arm 80, a vertical driving cylinder 82 for vertically moving the shutter arm 78, and a vertical driving cylinder 84 for vertically moving the support pins 62.

Figure 4:
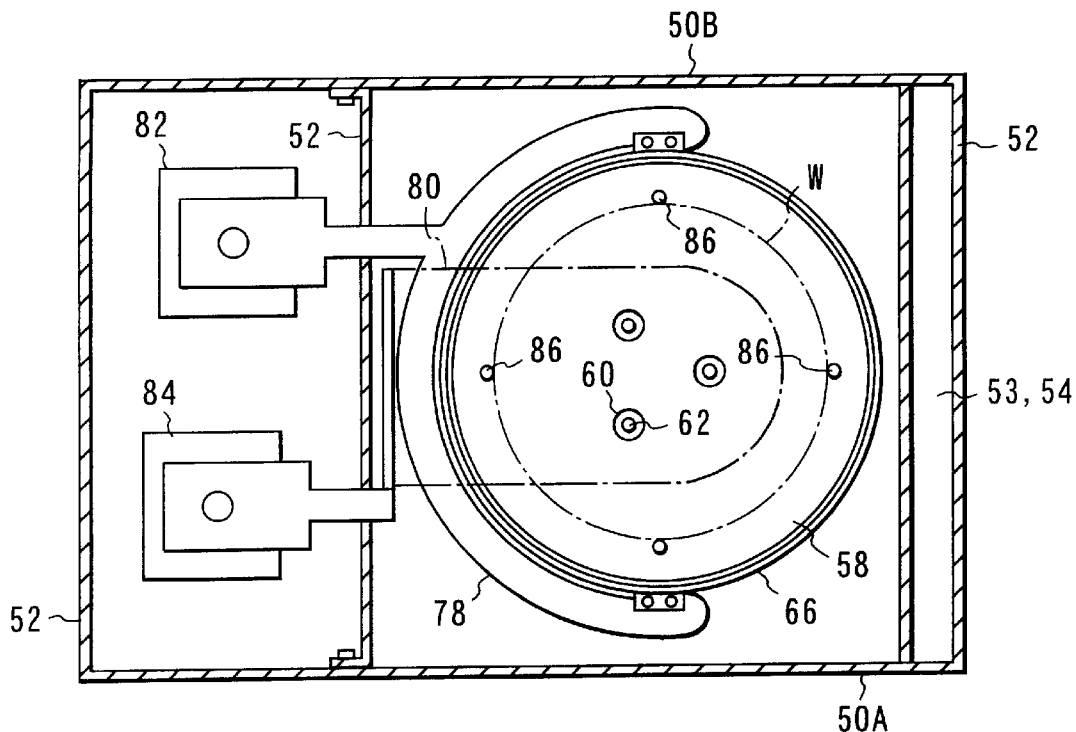
FIG. 4 is a plan view schematically showing a heat treating apparatus according to one embodiment of the present invention.
Figure 5:
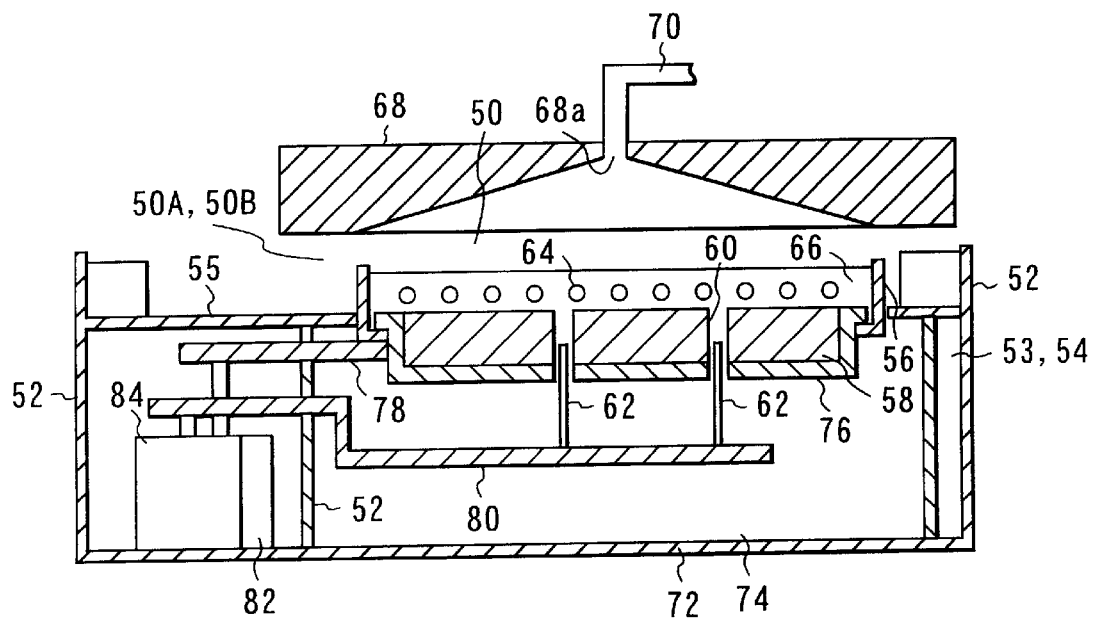
FIG. 5 is a vertical cross sectional view schematically showing a heat treating apparatus according to one embodiment of the present invention.

As shown in FIG. 4, a plurality of projections 86, for example 4 projections, for guiding and supporting the wafer W are formed on that portion of the surface of the hot plate 58 at which the outer circumferential portion of the wafer W is to be supported.

A free space is formed inside the hot plate 58. A heating medium is heated within the free space and the vapor of the heating medium generated by the heating is circulated within the free space so as to maintain the hot plate 58 at a predetermined temperature.

Figure 6:
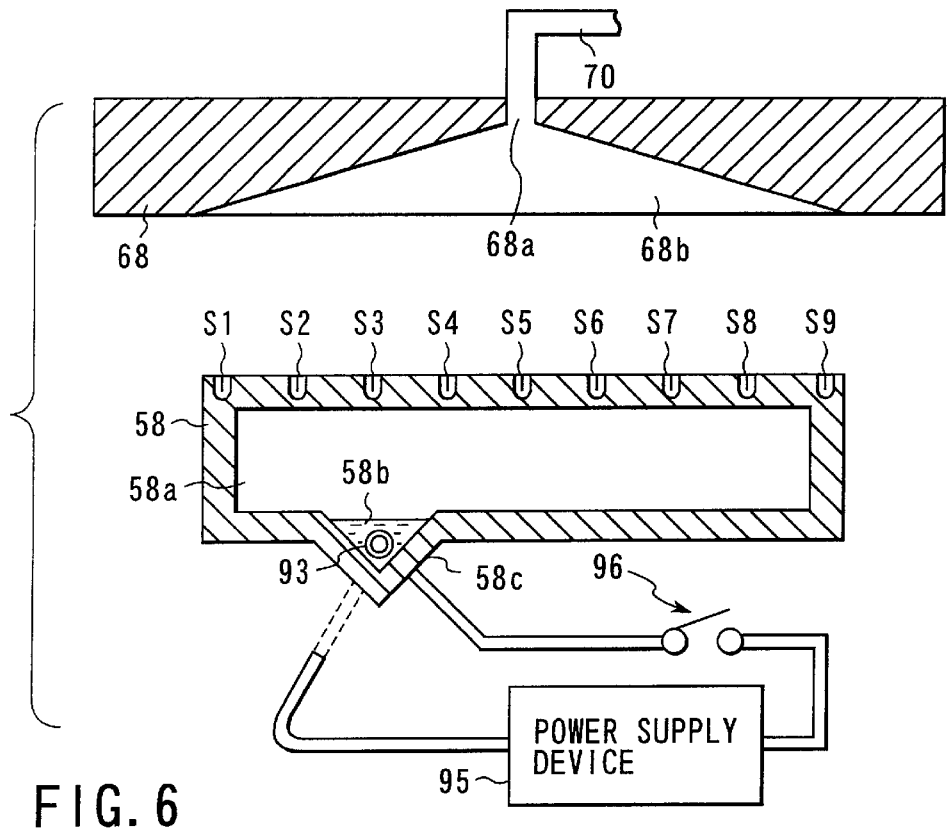
FIG. 6 is a vertical cross sectional view schematically showing a heat treating apparatus according to one embodiment of the present invention.

As shown in FIG. 6, a conical recess 68b is formed on the lower side of the cover body 68, and the exhaust port 68a is formed at the top of the conical recess 68b. Also, the lower end of the exhaust pipe 70 is connected to the exhaust port 68a. The other end of the exhaust pipe 70 is connected to an exhaust system (not shown) such that the heated gas moved upward by the heating with the hot plate 58 is collected in the conical recess 68b and, then, discharged to the outside through the exhaust port 68a and the exhaust pipe 70.

A closed space 58a is formed inside the hot plate 58, and a liquid reservoir 58c having a V-shaped cross section is formed in a part of the bottom of the closed space 58a. A heating medium 58b is stored in the liquid reservoir 58c, and a resistance heater 93 such as a nichrome wire is dipped in the heating medium 58b. An electric power is supplied from a power supply device 95 to the heater 93 under the control by the controller 120.

When an electric power is supplied from the power supply device 95 to the heater 93, heat is generated from the heater 93 so as to heat the heating medium 58b stored by condensation in the liquid reservoir 58c. The heated heating medium 58b is evaporated so as to be circulated within the closed free space 58a. When the evaporated heating medium is brought into contact with a cool portion within the closed free space 58a, heat is imparted from the vapor to the cool portion of the closed free space 58a and, at the same time, the vapor is condensed so as to be liquefied. It should be noted that the heat imparted from the heating medium to the hot plate 58 is a heat of evaporation of the heating medium, which is a constant value determined by the kind of the heating medium 58b. It follows that the temperature of the hot plate 58 can be maintained substantially constant, if a series of heat cycle ranging between evaporation of the heating medium 58b and condensation of the evaporated heating medium is stabilized to reach a steady state.

Figure 7:
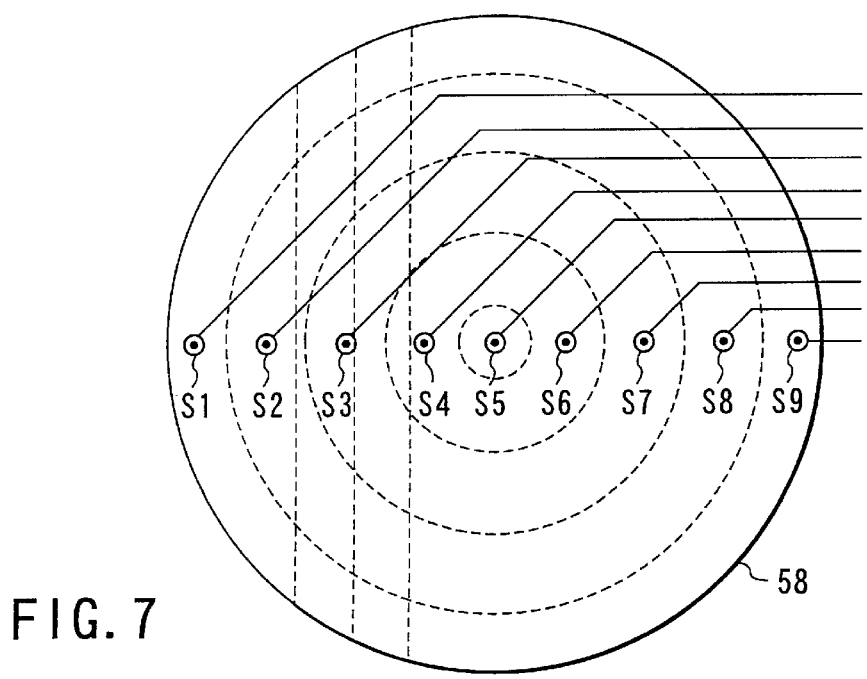
FIG. 7 is a plan view schematically showing a hot plate mounted to the heat treating apparatus according to one embodiment of the present invention.

As shown in FIGS. 7 and 6, a plurality of holes, e.g., nine holes, which are linearly arranged in a radial direction, are formed in an upper surface region of the hot plate 58. Thermocouple type sensors S1 to S9 are arranged in these nine holes. These thermocouple type sensors S1 to S9 are of the same manufacturing lot and are equal to each other in the temperature characteristics. These sensors are connected to a controller (not shown) that will be described herein later.

Figure 8:
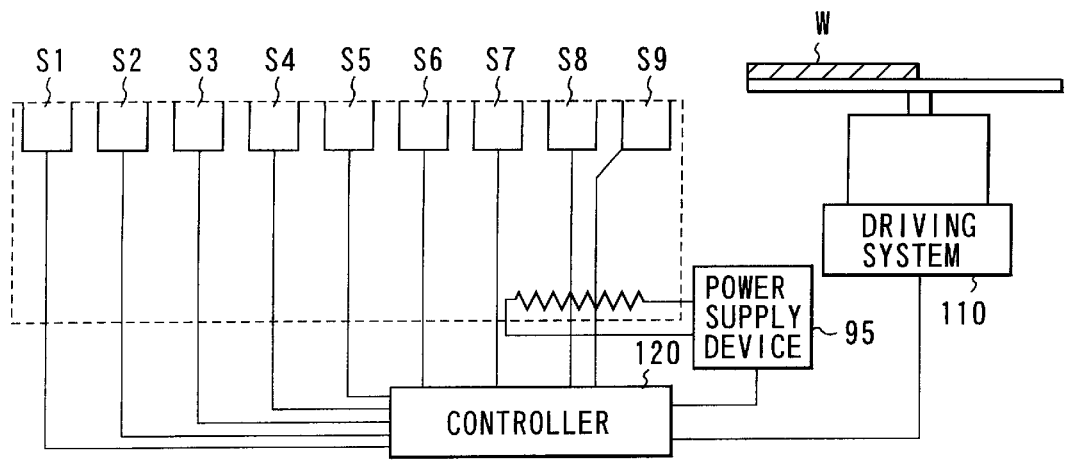
FIG. 8 is a block diagram showing a heat treating apparatus according to one embodiment of the present invention.

As shown in FIG. 8, the thermocouple type sensors S1 to S9 and the power supply device 95 for supplying an electric power to the heater 93 arranged within the hot plate 58 are connected to the controller 120.

The heat treating unit according to this embodiment will now be described.

In the heat treating unit of this embodiment, a change in temperature before and after placement of the wafer W on the hot plate 58 is detected in respect of a plurality of points on the upper surface of the hot plate 58. Whether or not the wafer W i8 is warped or the degree of warping is detected based on the detected temperature change. Where the degree of warping falls within an allowable range, the temperature of the hot plate is controlled at a first target temperature. On the other hand, where the degree of warping does not fall within the allowable range, the rated heat treatment of the wafer W is stopped and is switched to a temperature control for the succeeding wafer W so as to control the temperature at a second target temperature.

For comparison, let us describe first the control in the case where the wafer W that is not warped is placed on the hot plate 58.

Figure 9A:
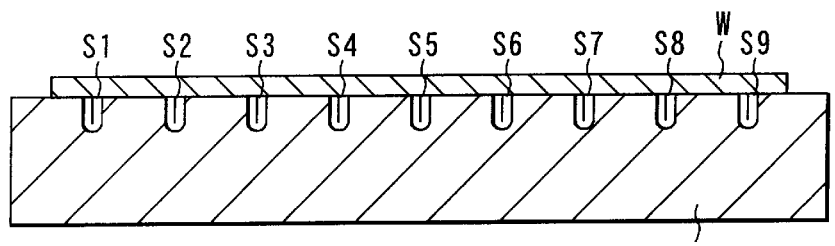
FIG. 9A is a cross sectional view schematically showing a hot plate having a normal wafer placed thereon.
Figure 9B:
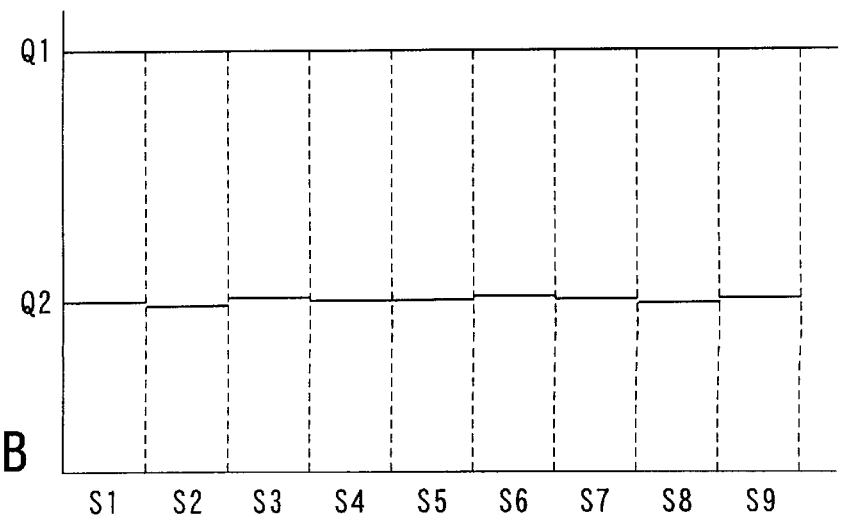
FIG. 9B shows the temperature characteristics of the hot plate having a normal wafer placed thereon.

FIG. 9B shows the change in temperature detected by the sensors S1 to S9 in a radial direction on the upper surface of the hot plate 58. On the other hand, FIG. 10 is a timing chart showing the presence or absence of the wafer W on the hot plate 58, the temperature of the hot plate 58, and the on-off state of the heater power source.

As shown in FIG. 10, if the wafer 10 is placed on the hot plate 58, the surface of the hot plate 58 is deprived of heat, with the result that the surface temperature of the hot plate 58 is rapidly lowered (t4). FIG. 9B shows in detail the change in temperature detected by the sensors S1 to S9 before and after placement of the wafer W on the hot plate 58 in a horizontal direction of the hot plate 58.

Where the wafer W that is not warped is placed on the hot plate 58, the lower surface of the wafer W is uniformly brought into contact with the upper surface of the hot plate 58 as shown in FIG. 9A, with the result that the hot plate 58 is deprived of heat uniformly in the horizontal direction of the hot plate 58. When it comes to the change in temperature detected by the sensors S1 to S9 on the upper surface in the radial direction of the hot plate 58, the temperature Q1(° C.) before placement of the wafer W on the hot plate 58 is uniformly lowered to the temperature Q2(° C.) after placement of the wafer W as shown in FIG. 9B. In other words, there is no substantial difference in the temperature change before and after placement of the wafer W on the hot plate 58 in the horizontal direction of the hot plate 58.

Where there is no substantial difference in the temperature change in the horizontal direction of the hot plate 58, the controller 120 judges that the wafer W now placed on the hot plate 58 is not warped so as to control the temperature of the hot plate 58 at a first target temperature T1 to T2(° C.).

Figure 11A:
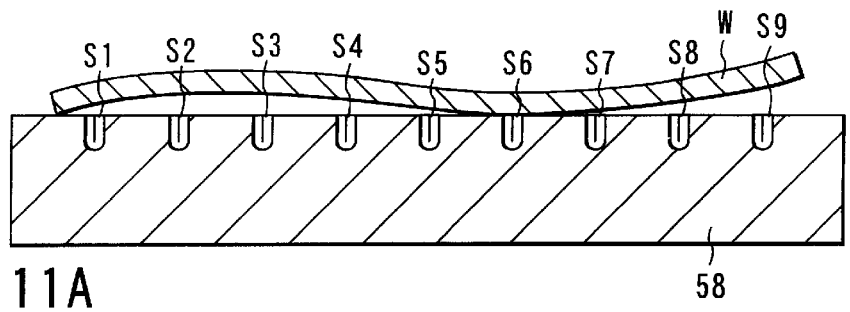
FIG. 11A is a cross sectional view schematically showing a hot plate having a warped wafer placed thereon.

On the other hand, FIG. 11 covers the case where a warped wafer W is placed on the hot plate 58. Where the wafer W is warped to present an S-shaped cross section as shown in FIG. 11A, the lower surface of the wafer W is brought into contact only partially with the upper surface of the hot plate 58. In the example shown in FIG. 11A, the wafer W is brought into contact with the hot plate 58 in only the portions where the sensors S1, S2 and S6 to S8 are mounted.

Where the wafer W warped to present an S-shaped cross section is placed on the hot plate 58, the hot plate 58 is deprived of heat in only the portions in contact with the sensor portions S1, S2 and other sensor portions S6 to S8 of the warped wafer W, leading to lower temperatures. In other portions of the hot plate 58 corresponding to the sensor portions S3, S4 and S9 of the warped wafer W, the heat is released from the hot plate 58 in a small amount, leading to a small degree of temperature drop in these portions of the hot plate 58.

Where the amount of heat released from the hot plate 58 is non-uniform in the horizontal direction, the amount of the temperature change in the horizontal direction, which is detected by the sensors S1 to S9, is monitored by the controller 120. In other words, the controller 120 is always aware of the difference in the temperature change in the horizontal direction of the hot plate 58. Where the difference in the temperature change is within the allowable range, the controller 120 judges that the degree of warping of the wafer W is within an allowable range so as to control the temperature of the hot plate 58 at the first target temperature T1 to T2(° C.), as described above.

On the other hand, where the difference in the temperature change exceeds the allowable range, the controller 120 judges that the degree of warping of the wafer W exceeds the allowable range so as to change the temperature control from the first target of T1 to T2(° C.) covering the case where the wafer W is not warped to a second target temperature of T3 to T4(° C.).

The allowable range in the difference of the temperature change in this case is ±3×σ of the average value, where σ represents a standard deviation. The particular range constitutes the allowable range because 99.7% falls within the particular range.

The second target temperature T3 to T4(° C.) represents the temperature of the wafer W that is to be subjected to the heat treatment on the hot plate 58 after completion of the heat treatment applied to the wafer W now placed on the hot plate 58. In the heat treating unit of this embodiment, where the temperature change before and after placement of the wafer W on the hot plate 58 is large in the horizontal direction of the hot plate 58 and, thus, the wafer W is judged to have been warped, the wafer W is judged to be defective and the heat treatment of the defective wafer W is stopped. Then, the apparatus is controlled to provide an ideal temperature environment for the succeeding wafer W. What permits achieving the ideal temperature environment is the second target temperature T3 to T4(° C.).

Where the heat treating unit is used as a pre-baking unit (PREBAKE), the unit is operated as follows.

In the first step, the wafer W is taken out of the wafer cassette CR disposed on the cassette table 20 by the sub-transfer arm mechanism 21, followed by delivering the wafer W from the sub-transfer arm mechanism 21 to the main transfer arm mechanism 22. The wafer W received by the main transfer arm mechanism 22 is transferred into the resist coating unit (COT). A resist coating treatment is applied to the wafer W set within the resist coating unit (COT). Then, the wafer W is taken out of the resist coating unit (COT) by the main transfer arm mechanism 22 so as to be transferred into the heat treating unit. Then, the wafer W is placed on the hot plate 58 within the heat treating unit.

On the other hand, the power source for the heat treating unit is turned on. At the same time, the power supply device 95 for supplying an electric power to the heater 93 within the hot plate 58 is turned on. As a result, the hot plate 58 is maintained at the first target temperature a predetermined time later. In this step, the temperature of the hot plate 58 is detected by the nine thermocouple type sensors S1 to S9 so as to detect the temperature distribution on the upper surface in the radial direction of the hot plate 58. The temperature distribution thus detected is stored in a memory section (not shown) of the controller 120.

The temperature is detected again by the sensors S1 to S9 after the wafer W was placed on the hot plate 58. The temperature thus detected is compared with the temperature stored in the memory section of the controller 120 so as to calculate the temperature change before and after placement of the wafer W on the hot plate 58 for each of the sensors S1 to S9.

The values of the temperature change thus calculated are compared among the sensors S1 to S9 so as to determine the deviation in the temperature change in the horizontal direction of the hot plate 58.

If the deviation in the temperature change is small as shown in FIG. 9B to fall within the above-noted allowable range of ±3×σ, the degree of warping is judged to fall within the allowable range and, thus, the control target temperature of the hot plate 58 is controlled at the first target temperature T1 to T2(° C.).

As shown in FIGS. 10A, 10B and 10C, the temperature of the hot plate 58 is controlled such that the heater power source is turned on when the temperature of the hot plate 58 is dropped to a level lower than the temperature T2 at time t0 to t1 and time t2 to t3 before the wafer W is placed on the hot plate 58. When the temperature of the hot plate 58 is elevated to exceed the temperature T1, the heater power source is turned off to permit the temperature of the hot plate 58 to fall within a range of between the first target temperature of T1 to T2. Under this condition, the wafer W is placed on the hot plate 58 at time t4.

Let us describe separately the case where a satisfactory wafer W, which is not warped or the warping is small to fall within the allowable range, is placed on the hot plate 58 and the case where a defective wafer W that is greatly warped is placed on the hot plate 58.

Where the wafer W is not warped as shown in FIG. 9A, the lower surface of the wafer W is uniformly brought into contact with the upper surface of the hot plate 58 over the entire region of the wafer W. As a result, the upper surface of the hot plate 58 is deprived of heat uniformly. FIG. 9B shows the temperature change detected by the sensors S1 to S9 in this case. As apparent from FIG. 9B, the temperature detected by the sensors S1 to S9 before placement of the wafer W on the hot plate 58 was substantially Q1(° C.) and was lowered to substantially Q2(° C.) after placement of the wafer W. The temperature change before and after placement of the wafer W is Q1–Q2. What should be noted is that the change in temperature detected by the sensors S1 to S9 before and after placement of the wafer W is substantially constant in the horizontal direction of the hot plate 58.

If there is no difference in the temperature change in the horizontal direction of the hot plate 58, the controller 120 receiving the detection signal judges that the wafer W is not warped so as to control the temperature of the hot plate 58 at the first target temperature T1 to T2. It should be noted that the first target temperature T1 to T2(° C.) represents the temperature at which an ideal heat treating temperature is applied to the wafer W when a satisfactory wafer W free from warping is placed on the hot plate 58. It follows that the temperature of the hot plate 58 is rapidly lowered when the wafer W is placed on the hot plate 58 at time t4 and, then, the temperature is elevated by the heat supplied from the heater and the heat stored in the hot plate 58 so as to arrive at an ideal heat treating temperature. Then, the wafer W having a series of heat treatments applied thereto is transferred from the hot plate 58, and the same treatments are applied to the succeeding wafer W placed on the hot plate 58.

Figure 11B:
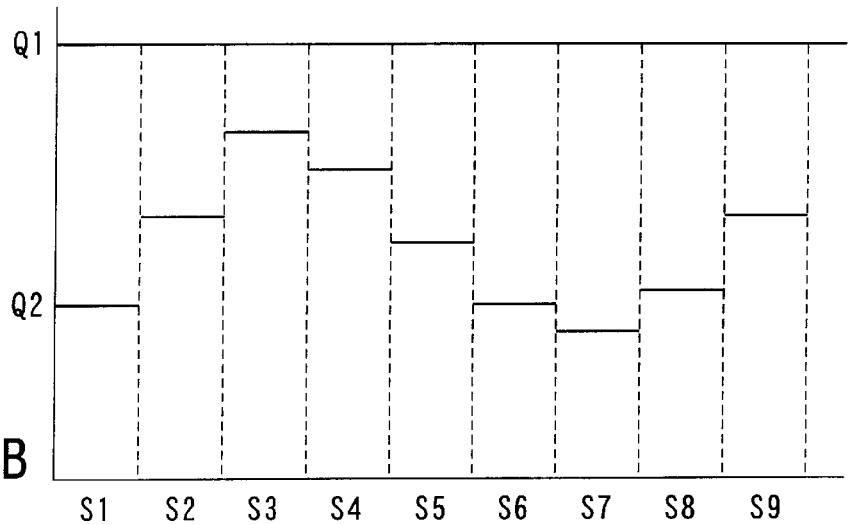
FIG. 11B shows the temperature characteristics of the hot plate when a wafer is placed thereon.

On the other hand, where a defective wafer W having a large warping as shown in FIG. 11A is placed on the hot plate 58, the temperature change detected by the sensors S1 to S9 in the horizontal direction of the hot plate 58 is rendered non-uniform, as shown in FIG. 11B. To be more specific, the temperature change detected by the sensors S3, S4, S5 before and after placement of the wafer W on the hot plate 58 is small. However, the temperature change detected by the sensors S1, S2, S6, S7 and S8 before and after placement of the wafer W on the hot plate 58 is large.

If there is a large difference in the temperature change before and after placement of the wafer W on the hot plate 58 on the upper surface of the hot plate 58, the controller 120 judges that the wafer W placed on the hot plate 58 is warped greatly and, thus, the wafer W1 is defective so as to perform switching from a first target temperature θa (allowable range T1 to T2) to a second target temperature θa' (allowable range T3 to T4).

If the target temperature is switched to the second target temperature θa', the heater power source is not turned on until the temperature on the upper surface of the hot plate 58 having the wafer W1 placed thereon is lowered to a level lower than the lower limit T4, as denoted by a solid line A shown in FIG. 12B. On the other hand, where the temperature of the hot plate 58 falls within the first target temperature θa, the heater power source is not turned on until the temperature on the upper surface of the hot plate 58 having the wafer W1 placed thereon is lowered to a level lower than the lower limit T2, as denoted by a dotted curve B shown in FIG. 12. Since the lower limit T4 of the second target temperature θa' is lower than the lower limit T2 (T4<T2) of the first target temperature θa, the temperature of the hot plate 58 after switching to the second target temperature θa' is held at a low level.

The defective wafer W1 has a large warping and, thus, is brought into contact only partially with the hot plate 58. Accordingly, the amount of heat released from the hot plate 58 to the wafer W1 is small. Such being the situation, the temperature of the hot plate 58 is controlled at a relatively low level when the defective wafer W1 is placed on the hot plate 58.

It should be noted that the second target temperature θa' in this stage corresponds to the temperature at which an ideal heat treating temperature can be obtained when the succeeding wafer W2, which is supposed to be a satisfactory wafer free from warping, is placed on the hot plate 58. Therefore, the hot plate 58 is allowed to exhibit an ideal temperature when the succeeding wafer W2 is placed on the hot plate 58 at time t8 et seq. So as to prevent an adverse effect given to the succeeding wafer W. It should be noted that the dotted curve B shown in FIG. 12B represents the temperature history of the hot plate 58 in the case where the temperature of the hot plate 58 is controlled at the first target temperature θa in respect of the wafer W free from warping. On the other hand, a dot-and-dash curve C shown in FIG. 12B represents the temperature history of the hot plate 58 covering the case where the temperature of the hot plate 58 is controlled by the first target temperature θa in respect of the warped wafer W1.

As apparent from FIGS. 12A to 12C, the temperature on the upper surface of the hot plate 58 is maintained at a lower level in the case where the temperature is controlled by the second target temperature θa' than in the case where the temperature is controlled by the first target temperature θa. It follows that an ideal temperature environment can be obtained toward the succeeding wafer W2, if the temperature of the hot plate 58 is controlled based on the second target temperature θa.

According to the heat treating apparatus of the present invention, a plurality of temperature sensors S1 to S9 are arranged in an upper surface region of the hot plate 58 to permit these temperature sensors to detect the temperature change before and after placement of the wafer W1 on the hot plate 58. As a result, it is possible to know based on the detected temperature change whether or not the wafer W1 is warped and to know the degree of warping, if the wafer W1 is warped. What should also be noted is that, if the degree of warping of the wafer W1 exceeds an allowable range, the target temperature of the hot plate is switched so as to provide an ideal temperature environment for the succeeding wafer W2.

As described above, whether the wafer W now placed on the hot plate 58 is normal or abnormal is kept monitored and, if the wafer W is judged to be abnormal, the target temperature of the hot plate is switched for the succeeding wafer W. Therefore, the abnormal wafer W can be found easily and the temperature control of the hot plate can be set again for the succeeding normal wafer W. It follows that the degradation in the quality of the heat treatment applied to the succeeding wafer W can be suppressed at the minimum level.

In the embodiment described above, the hot plate is heated indirectly by the heater 93 via the heating medium 58b. Alternatively, it is possible to bury a resistance heater such as a nichrome wire in the hot plate so as to heat directly the hot plate.

Further, in addition to the embodiment described above, it is also possible to arrange a plurality of temperature sensors in a surface region of the hot plate 58 such that the buried temperature sensors are arranged in two horizontal directions perpendicular to each other and crossing each other in the center on the upper surface of the hot plate 58. In this case, it is possible to detect the warping of the wafer W in two radial directions perpendicular to each other.

Also, in addition to the embodiment described above, it is possible to detect whether the wafer W is warped and the degree of warping, if the wafer W is warped, by measuring the pressing force applied from the wafer W to the hot plate 58 or by measuring the clearance between the upper surface of the hot plate 58 and the lower surface of the wafer W.

In the apparatus of the embodiment described above, the abnormal wafer W can be found easily. In addition, the information obtained from the abnormal wafer W can be fed back so as to control appropriately the succeeding normal wafer W.

In addition, in the apparatus of the embodiment described above, a plurality of temperature sensors are arranged to form a row in a radial direction of the hot plate, making it possible to find the warping of the wafer W over the entire region along the diameter of the wafer W.

Further, in the apparatus of the embodiment described above, it is possible to arrange a plurality of pressure sensors in a surface region of the hot plate as a means for detecting the warping of the wafer W. In this case, it is possible to judge promptly whether the wafer W is warped and whether the warping, if the wafer is warped, falls within an allowable range or not.

Still further, in the apparatus of the embodiment described above, it is possible to arrange a plurality of distance measuring devices in a surface region of the hot plate as a means for detecting the warping of the wafer W. In this case, it is possible to judge promptly whether the wafer W is warped and whether the warping, if the wafer is warped, falls within an allowable range or not.

Figure 13:
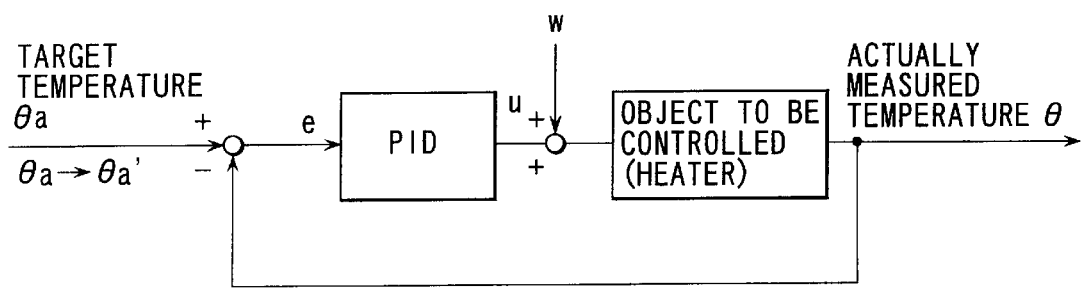
FIG. 13 is a PID control circuit used in a heat treating apparatus of the present invention.

Let us describe how to control the temperature of the hot plate with reference to FIG. 13.

In the first step, the first target temperature θa (allowable range T1 to T2) is supplied to the memory of the controller 120. Then, the temperature of the upper surface of the hot plate 58 on which the wafer W is place is measured by the temperature sensors S1 to S9 so as to obtain an actually measured temperature θ. The actually measured temperature θ thus obtained is compared with the first target temperature θa. If the actually measured temperature θ is deviated from the first target temperature θa, a deviation e is generated. The deviation e is controlled by a control section of the controller 120, and an operation amount u for diminishing the deviation e is given from the control section to the object to be controlled (heater 93). Then, the temperature of the upper surface of the hot plate 58 is measured again by the temperature sensors S1 to S9 to obtain an actually measured temperature θ. The actually measured temperature θ thus obtained is compared with the first target temperature θa, and an operation amount u controlled by the control section of the controller 120 in a manner to diminish the deviation e is imparted to the object to be controlled (heater 93). By repeating the operations described above, the deviation e is allowed to infinitely approach zero, with the result that the actually measured temperature θ on the upper surface of the hot plate 58 is rendered substantially equal to the first target temperature θa.

Incidentally, a PID control is performed in the control section (CPU) of the controller 120. The PID control is a combination of three control operations, i.e., a proportional action, an integral action and a differential action. At the beginning of the deviation occurrence, a large correction is carried out by the D (differential) action. Then, the correction is carried out stably and without fail by the combination of the P (proportion) action and the I (integral) action. The operation amount u subjected to the PID control can be given by equation (1) given below:

$$u = Kp \cdot e + Ki(\int e \, dt) + Kd(de/dt) + u_0 \qquad (1)$$

where Kp denotes the gain of the P action, Ki denotes the gain of the I action, Kd denotes the gain of the D action, and $u_0$ denotes the control offset. It should be noted that the gain Ki of the I action is a reciprocal of the integral time Ti (Ki=1/Ti). On the other hand, the gain Kd of the D action is equal to the differential time Td (Kd=Td).

It is possible for a disturbance w to enter the control circuit when the operation amount u is imparted from the control section of the controller 120 to the object to be controlled. The disturbance w and the deviation e enter the control circuit quite independently of each other so as to generate a new deviation. For example, if the hot plate 58 is forcedly cooled by blowing a gas against the hot plate 58 having the wafer W placed thereon, the actually measured temperature θ is lowered so as to increase the deviation e. Under the particular state under which a disturbance enters the control circuit, the initial large deviation is promptly corrected by the D action. Then, if the disturbance is removed, the actually measured temperature θ of the hot plate 58 is promptly corrected to the first target temperature θa by the D action having a high response property.

Incidentally, the same control operation is also executed in the case where the first target temperature θa (allowable range T1 to T2) is switched to the second target temperature θa' (allowable range T3 to T4). Also, the control offset $u_0$ is a constant value that is added to the control amount. The control offset $u_0$ is supplied as, for example, a dummy signal from a signal transmitter to the power supply device.

Figure 14:
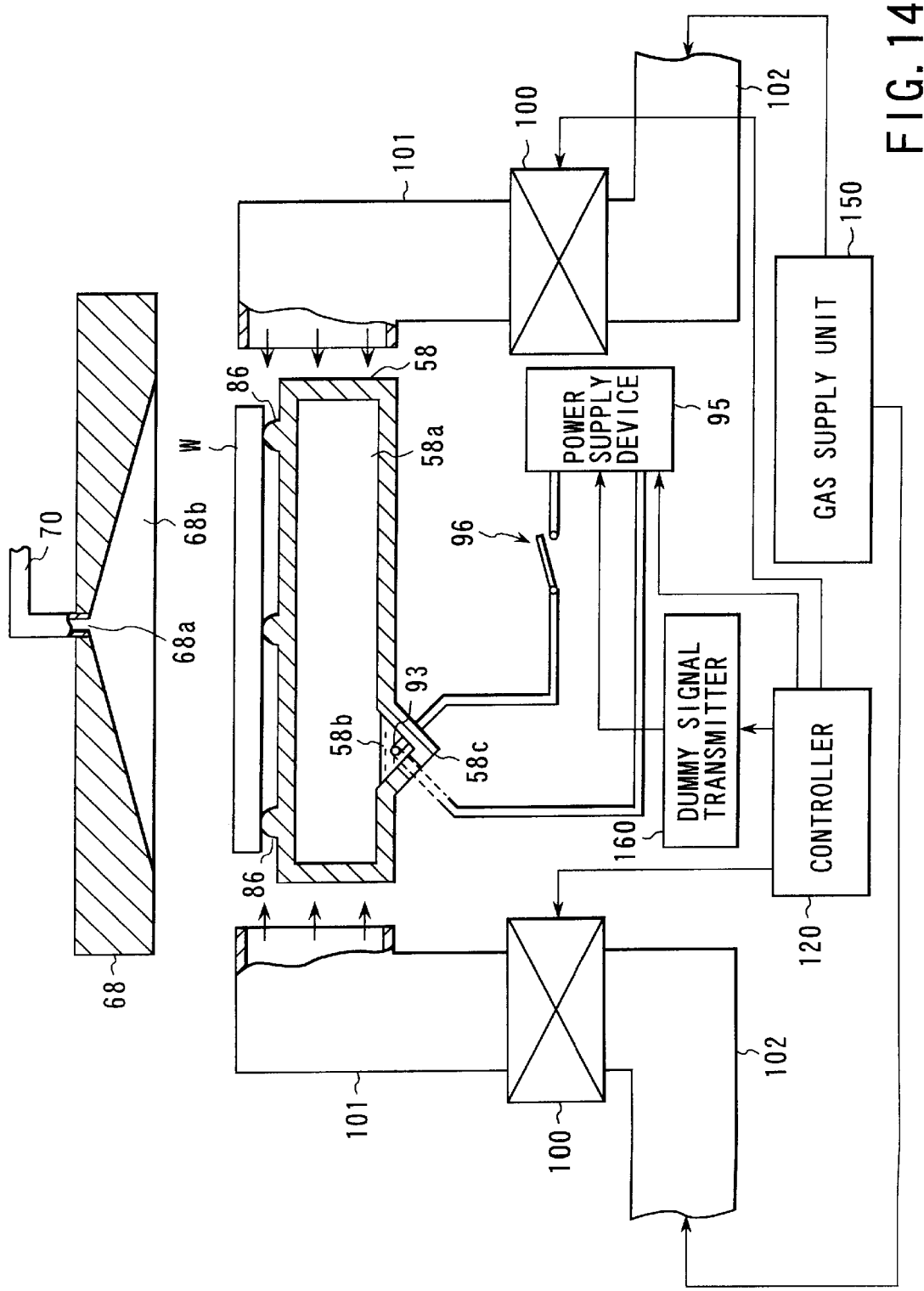
FIG. 14 is a vertical cross sectional view schematically showing a heat treating apparatus according to another embodiment of the present invention.

A heat treating apparatus according to another embodiment of the present invention will now be described with reference to FIGS. 14 and 15.

The heat treating apparatus in this embodiment comprises a plurality of gas ducts 101 arranged in the vicinity of the hot plate 58. Each of these gas ducts 101 communicates with a fluid passageway 102 of a gas supply unit 150 via a valve 100 and is open at the side portion of the hot plate 58. Gases such as the air and an inert gas are housed in the gas supply unit 150. The degree of opening of the valve 100 is controlled by the controller 120 so as to control the gas supply rate to the duct 101. The gas is blown from the gas duct 101 toward the side portion of the hot plate 58 so as to flow along the upper surface of the hot plate 58 and is circulated through the clearance between the upper surface of the hot plate 58 and the lower surface of the wafer W.

Figure 15:
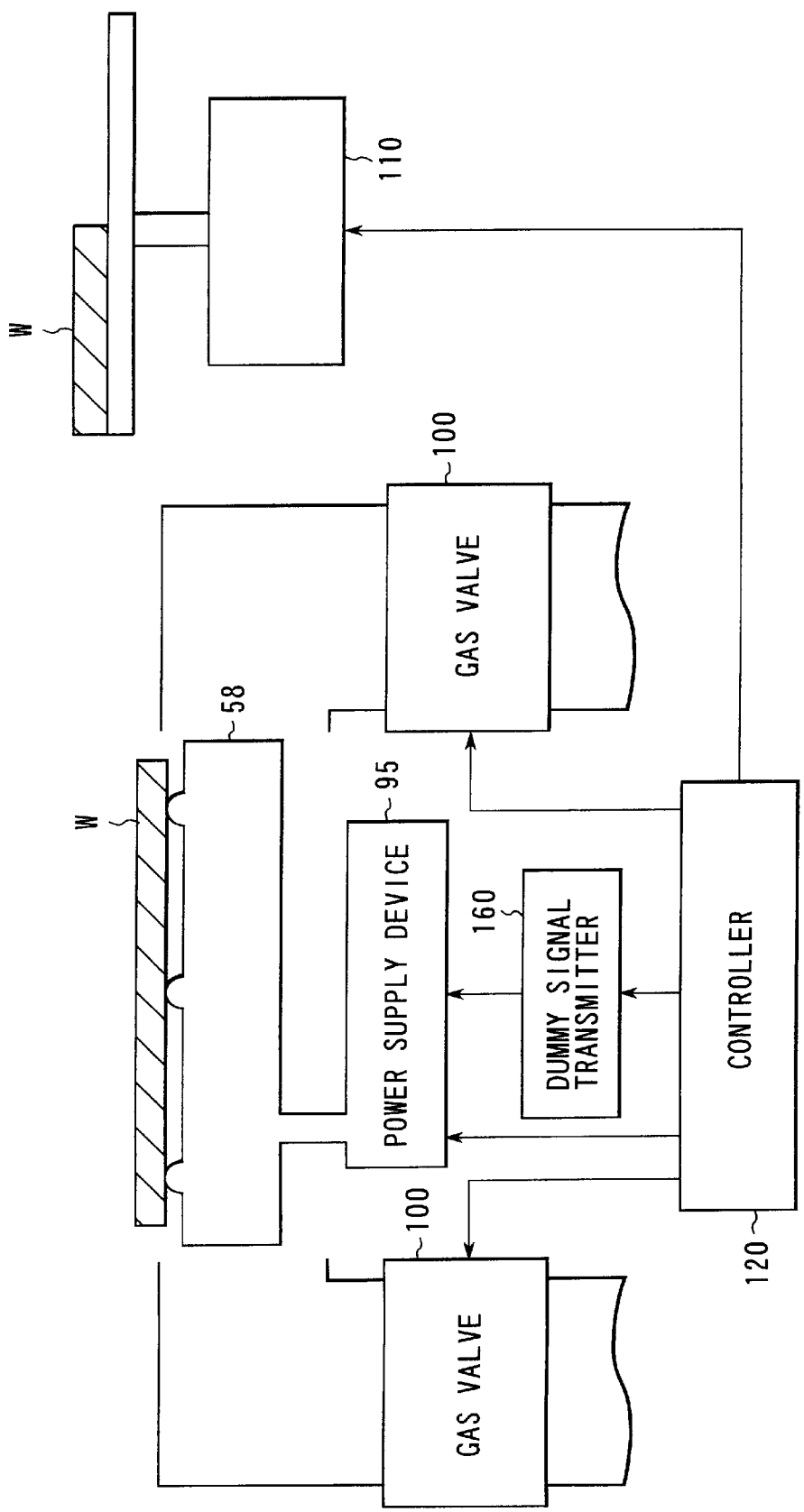
FIG. 15 is a control block diagram of a heat treating apparatus according to another embodiment of the present invention.
Figure 16:
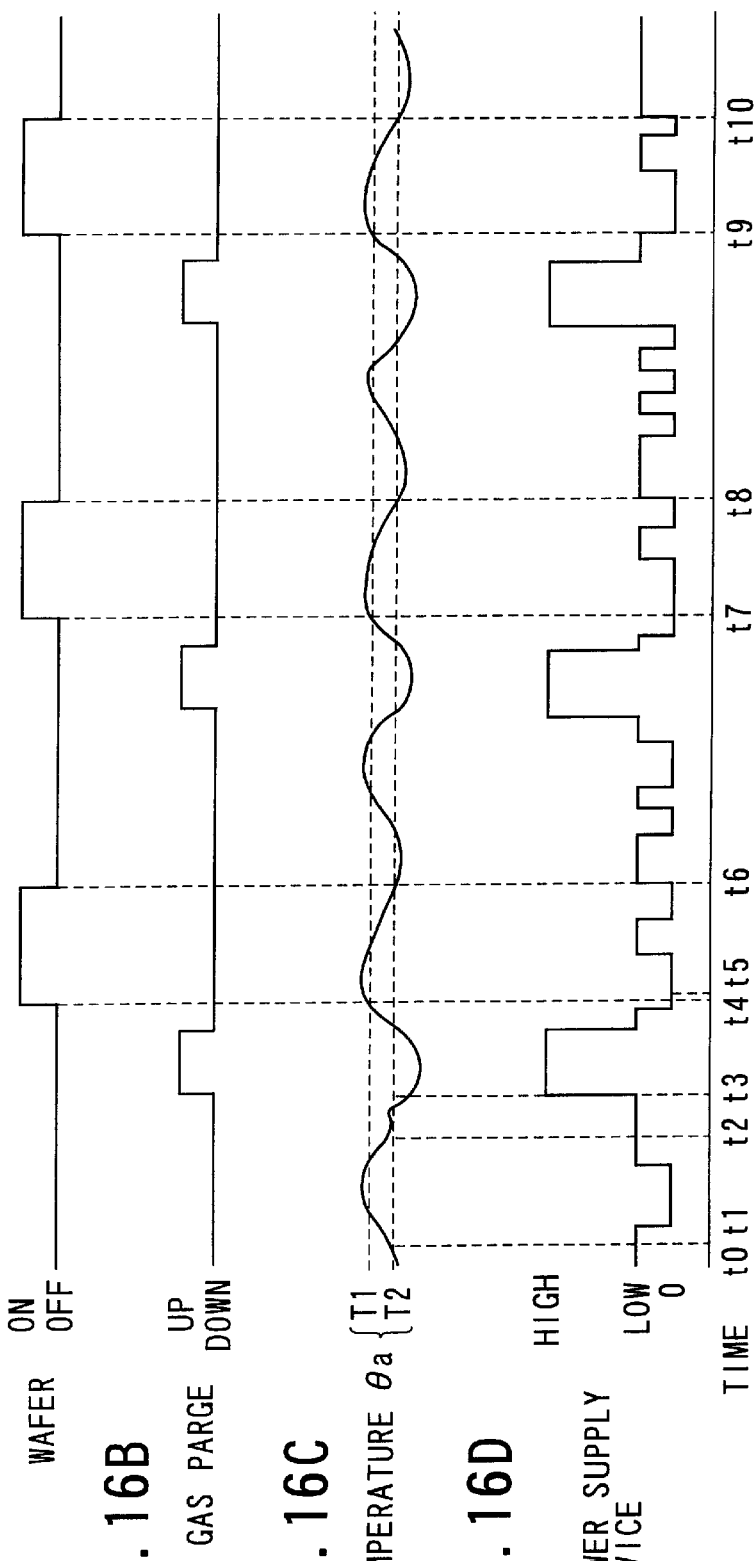
FIG. 16A is a timing chart showing the presence or absence of a wafer on a hot plate.
FIG. 16B is a timing chart showing the change in the flow rate of a purge gas.
FIG. 16C shows the change in temperature of the hot plate.
FIG. 16D is a timing chart showing the change in power supply to the hot plate.

As shown in FIG. 15, the output section of the controller 120 is connected to the power source circuit for each of the power supply device 95, the gas valve 100, the driving mechanism 110 for the main transfer arm mechanism 22 and the dummy signal transmitter 160. The power supply device 95 serves to supply an electric energy to the heater 93 arranged within the hot plate 58. The dummy signal transmitter 160 is interposed between the controller 120 and the power supply device 95. The dummy signal transmitter 160 receives a command signal from the controller 120 and transmits a dummy signal to the power supply device 95 based on the command signal received from the controller

120. The dummy signal serves to impart the control offset $u_0$ to the power supply device 95. The control offset $u_0$ is added as a constant control amount in the PID control.

How to control the heat treating apparatus of the construction described above will now be described.

During the period between the removal of the preceding wafer W from the hot plate 58 and the placement of the succeeding wafer W on the hot plate 58, the amount of the gas blown from the duct 101 toward the hot plate 58 is increased. If the gas blow rate is increased, the surface temperature of the hot plate 58 is lowered. The temperature drop is detected by a temperature sensor S10, and the detection signal is transmitted to the controller 120. A signal denoting the compulsory cooling of the hot plate 58 enters the control circuit as a disturbance. Then, the controller 120 delivers a command signal to the power supply device 95 to increase the power supply rate so as to eliminate the deviation e increased by the disturbance entering the control circuit. As a result, the power supply rate to the heater 93 is increased so as to increase the heat energy imparted to the hot plate 58. At this stage, the wafer W is not placed on the hot plate 58 and, thus, the heat capacity of the hot plate 58, on which the wafer W is not placed, is relatively small. However, the increase in the gas supply rate seemingly causes the heat capacity of the hot plate 58 to be increased. In order to maintain the temperature of the hot plate 58 having an increased apparent heat capacity at the target temperature, the heat generation rate of the heater 93 is increased so as to increase the latent temperature-elevating capacity of the hot plate 58.

Then, if the gas supply rate is decreased and the wafer W is placed on the hot plate 58, the temperature of the hot plate 58 is rapidly elevated in spite of the placement of the wafer W on the hot plate 58 so as to arrive at the target temperature θa in a short time.

Let us describe the operation of the heat treating apparatus in the case where the apparatus is used as a pre-baking unit (PREBAKE) with reference to FIGS. 16A to 16D.

The main transfer arm mechanism 22 takes wafer W out of the resist coating unit (COT) and transfers the wafer W thus taken out to the pre-baking unit (PREBAKE). Then, the wafer W is placed on the hot plate 58 within the pre-baking unit (PREBAKE).

On the other hand, an electric power is supplied from the power supply device 95 to the heater 93 at the time when the power source of the pre-baking unit (PREBAKE) is turned on so as to control the temperature of the hot plate 58 at the first target temperature θa (T1 to T2). In order to maintain the first target temperature θa (T1 to T2), the heater power source switch 96 is kept turned on when the temperature of the hot plate 58 is lowered to a level lower than the lower limit T2(° C.), and the heater power source switch 96 is turned off when the temperature is elevated to exceed the upper limit T1(° C.). Where the temperature of the hot plate 58 is intermediate between the upper limit T1 and the lower limit T2, the heater power source switch 96 is intermittently turned on and off repeatedly. It should be noted that, while the temperature of the hot plate 58 is changed within the first target temperature θa (T1 to T2), the power source supplies a low power, e.g., 50 W/h, to the heater 93.

When time t3 has been passed to approach time t4 at which the wafer W is placed on the hot plate 58, the controller 120 permits the degree of opening of the valve 100 to be increased so as to increase the gas blow rate (purge rate) against the hot plate 58. If the gas purge rate is increased, the amount of heat released from the surface of the hot plate 58 per unit time is increased so as to rapidly lower the temperature of the hot plate 58 (time t3). The rapid temperature drop is detected by the temperature sensor S10, and the detection signal is supplied to the controller 120. Upon receipt of the detection signal, the controller 120 permits increasing the power supply rate to the heater 93 so as to bring the temperature of the hot plate 58 back to the first target temperature θa promptly. For example, if the low output state (LOW) during the time t0 to t3 is supposed to be 50 W/h, the output state is increased to 100 W/h at time t3 so as to realize a high output state (HIGH). Under the high output state, the temperature of the hot plate 58 is rapidly elevated, and the temperature of the hot plate 58 is controlled at the timing that the temperature of the hot plate 58 is set at the temperature T1 at time t4 when the wafer W is placed on the hot plate 58.

If the wafer W is placed on the hot plate 58 at time t4, the surface of the hot plate 58 is deprived of heat by the contact with the wafer W. However, the heat generated under the high output state starting from time t3 is accumulated in the hot plate 58. Since the heat released from the hot plate 58 into the wafer W is offset by the accumulated heat, a rapid temperature change of the hot plate 58 is prevented, with the result that the temperature of the hot plate 58 is moderately increased from a level slightly higher than the temperature T1 to the temperature T2 over the period of time t5 to time t6. Similarly, the gas purge amount is increased during the period of time t7 to time t8 and the period of time t11 to time 12 so as to reach a high output state. The wafer W is placed on the hot plate 58 at time t9 and time t13 when the hot plate 58 bears the ideal temperature T1, and the wafer W is removed from the hot plate 58 at time t10 and time t14 when the hot plate 58 bears the temperature T2.

In the apparatus of the embodiment described above, a rapid temperature drop of the hot plate 58 does not take place even immediately after the wafer W is placed on the hot plate 58. Also, even if a rapid temperature drop takes place, the temperature of the hot plate 58 is brought back to the desired temperature in a very short time, making it possible to apply a heat treatment to the wafer W appropriately at the first target temperature θa.

In the embodiment described above, it is possible to use a hot plate having a resistance heater such as a nichrome wire buried therein in place of the hot plate 58. It is also possible to use a thermoelectric cooling element or a water cooling jacket in place of the compulsory cooling mechanisms 100, 101, 150 for decreasing the temperature of the hot plate 58.

Figure 17:
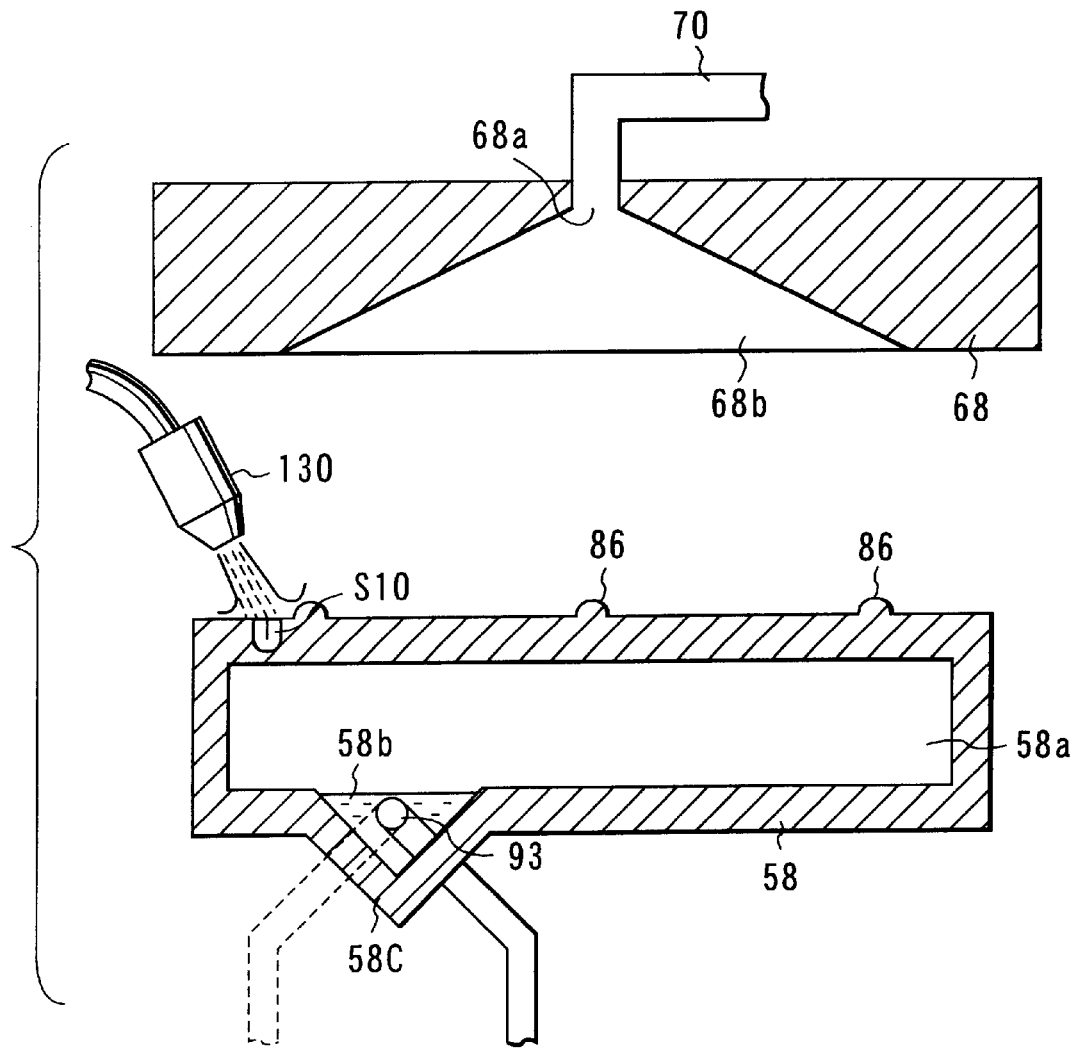
FIG. 17 is a vertical cross sectional view schematically showing a heat treating apparatus according to another embodiment of the present invention.

FIG. 17 shows a heat treating apparatus according to another embodiment of the present invention. Explanation of those portions of the apparatus shown in FIG. 17 which overlap with those included in the apparatus described previously is omitted in the following description.

The heat treating apparatus in this embodiment comprises a gas nozzle 130 arranged in the vicinity of the temperature sensor S10. The gas nozzle 130 serves to blow a gas such as the air or an inert gas (nitrogen gas) toward that portion of the hot plate 58 at which the temperature sensor S10 is mounted. The temperature of the gas blown from the nozzle 130 is controlled at room temperature (23° C.) or a temperature lower than room temperature.

In the apparatus of this embodiment, a gas is blown against a region in the vicinity of the mounting position of the temperature sensor S10 so as to intentionally lower the detected temperature. By this particular arrangement, the controller 120 judges that the entire temperature of the hot plate 58 has been lowered so as to temporarily increase the power supply rate to the heater 93.

Also, according to the apparatus of this embodiment, the controller 120 is operated without lowering the temperature of the entire hot plate 58. Therefore, the temperature sensor S10 is allowed to detect the true temperature of the hot plate 58 by stopping the spurting of the gas from the nozzle 130. As a result, it is possible to avoid the defect caused by transmission of a false signal (cooling by gas spurting) to the temperature sensor S10. For example, it is possible to avoid the detrimental effect that the temperature of the hot plate 58 is actually lowered too much, with the result that an unduly long time is required for bringing the temperature of the hot plate 58 back to a desired temperature. It should also be noted that, since the temperature of the entire hot plate 58 is not actually lowered and the temperature is actually lowered in only a region close to the temperature sensor S10, the temperature in the vicinity of the temperature sensor S10 is rapidly brought back to a desired level, making it possible to obtain high response characteristics between the on-off operation in terms of spurting of the gas from the gas nozzle and the thermal response.

In this embodiment, a gas is partially blown toward the mounting portion of the temperature sensor S10. Alternatively, it is possible to lower temporality the temperature of the mounting portion of the temperature sensor S10 by arranging, for example, a thermoelectric cooling element or a water-cooling pipe in the mounting portion of the sensor S10.

Figure 18:
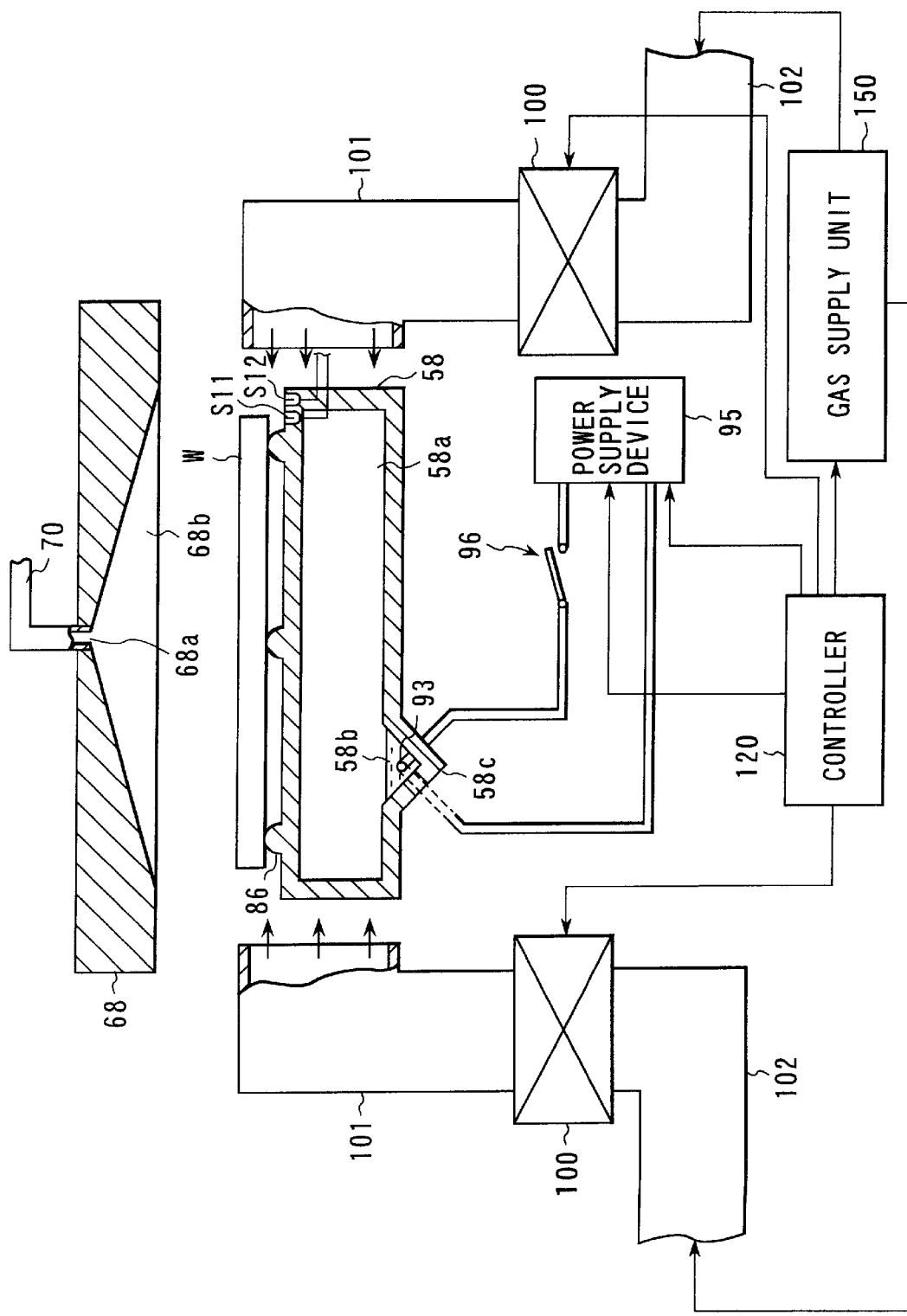
FIG. 18 is a vertical cross sectional view schematically showing a heat treating apparatus according to another embodiment of the present invention.

FIG. 18 shows a heat treating apparatus according to another embodiment of the present invention.

In this embodiment, two temperature sensors S11 and S12 are mounted to the upper surface region of the hot plate 58. The temperature sensor S11 is a general purpose sensor. For example, a sensor utilizing a thermocouple is used as the temperature sensor S11. The sensor S11, which is a temperature sensor that is generally used for a heat treatment, is connected to the controller 120 via a signal transmitting circuit such as an analog circuit or an amplifier described herein later.

On the other hand, the other sensor S12 is a high precision measuring instrument that permits measuring the temperature at an accuracy higher than that achieved by the sensor S11. A sensor provided with, for example, platinum (Pt) is used as the sensor S12. The high precision sensor S12, which is generally used for correcting the temperature measured by an ordinary sensor, has a high reliability and is low in changes with time. The high precision sensor S12 is connected to the controller 120 via a signal transmitting route such as an analog circuit or an amplifier that is different from that used for connecting the sensor S11 to the controller 120.

A plurality of gas ducts 101 are arranged in the vicinity of the hot plate 58. The air or an inert gas is allowed to flow through the gas duct from outside the hot plate 58 toward the center. The gas duct 101 communicates with the gas supply source 150. The gas forwarded through the gas duct 101 flows trough the side wall of the hot plate 58 and, then, along the upper surface of the hot plate 58 so as to supply the heat of the hot plate 58 to the wafer W placed on the hot plate 58.

The gas duct 101 is provided with a valve 100 so as to control the flow rate of the gas flowing within the gas duct 101. The valve 100 is connected to the controller 120 so as to control the flow rate of the gas flowing through the gas duct upon receipt of a control signal generated from the controller 120.

Figure 19:
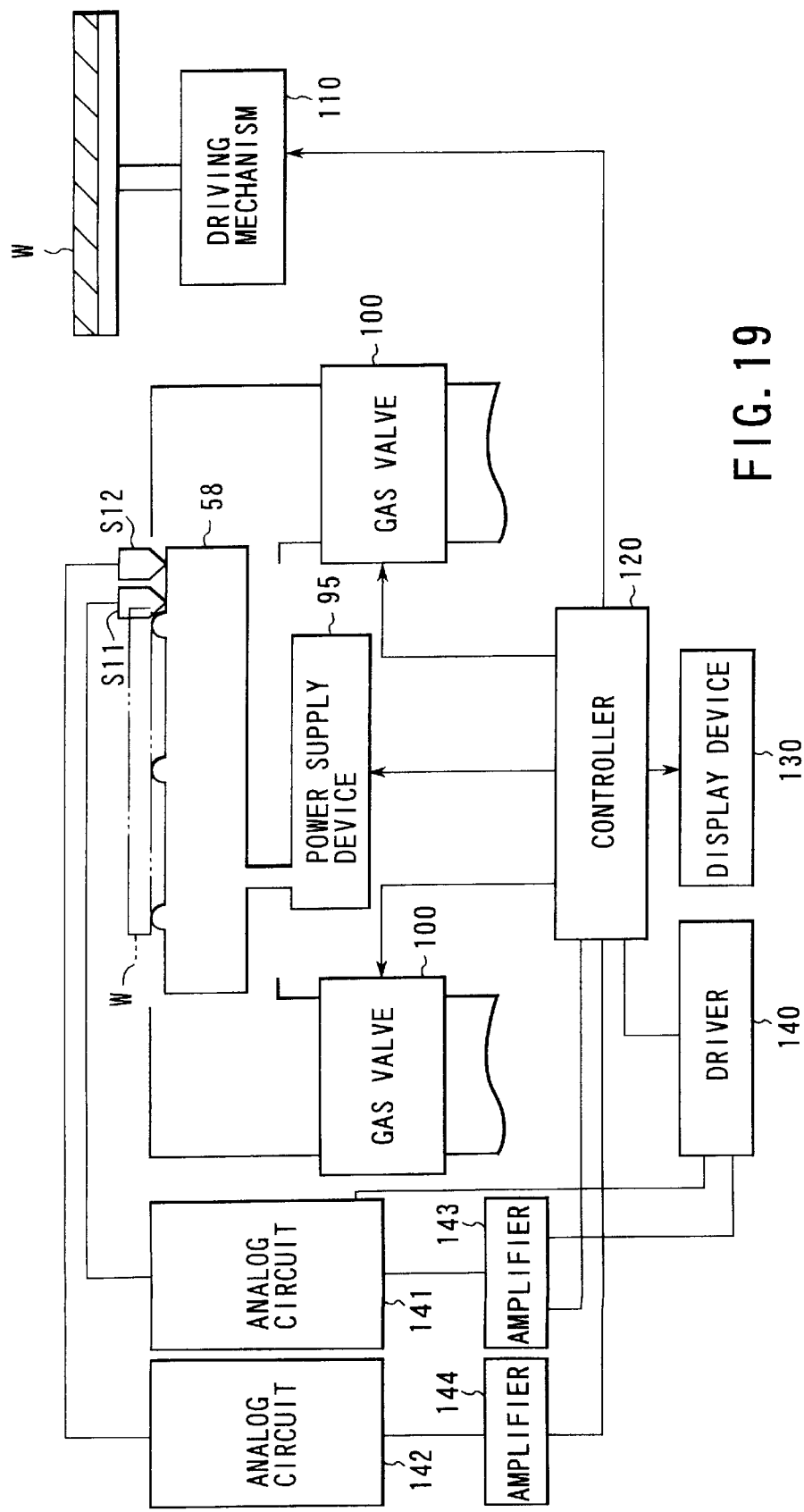
FIG. 19 is a block diagram showing a heat treating apparatus according to another embodiment of the present invention.

As shown in FIG. 19, the power supply device 95, the driving mechanism 110 of the main arm for transferring the wafer W onto the hot plate 58, and the gas valve 100 are collectively connected to the controller 120.

The general purpose sensor S11 is connected to the controller 120 via an analog circuit 141 and an amplifier 143. Further, the high amplifier sensor S11 is connected to the controller 120 via the analog circuit 142 and the amplifier 144.

Further, a display device 130 is connected to the controller 120. The display device 130 displays the temperatures detected by the general purpose sensor S11 and the high precision sensor S12, the difference between the two, and the necessity for renewing the general purpose sensor S11.

Further, the display device 130 is connected to a driver 140 via the controller 120. The driver 140 is further connected to the analog circuit 141 and the amplifier 143 so as to adjust the parameters of the analog circuit 141 and amplifier 143 so as to offset the detected values of the general purpose sensor S11 by the actually measured temperature of the hot plate 58.

How to control the heat treating unit of this embodiment will now be described.

In the heat treating unit of this embodiment, the temperature of the hot plate 58 is detected by the temperature sensor S11 and the high precision temperature sensor S12, and the detected values are compared so as to specify the cause of the temperature deviation.

The state of the trial operation of the apparatus including the heat treating unit of this embodiment, which is performed in a user's factory, is stored in a memory section (not shown) of the controller 120.

To be more specific, stored in the memory section are the power supply rate from the power supply device 95 to the heater 91 within the hot plate 58 during the trial operation, various parameters such as the gas flow rate toward the hot plate 58, the temperature ($T_{10}$) of the hot plate 58 relative to these parameters detected by the general purpose sensor S11, and the temperature ($T_{20}$) of the hot plate 58 relative to these parameters detected by the high precision sensor S12.

Where the temperature value detected by the general purpose sensor S11 deviates from the initially set target temperature of the hot plate 58 about six months to one year after installation of the apparatus, the cause of the temperature deviation is specified.

For specifying the cause, the parameters stored in the memory section are read out and the heat supply state in the trial operation is reproduced by converting the power supply amount to the heater 91 and the gas flow rate to the hot plate 58. Under this state, the temperature of the hot plate 58 is detected by the general purpose sensor S11 and the high precision sensor S12. The temperatures thus detected are compared with the temperature detected by the general purpose sensor S11 during the trial operation and stored in the memory section. Further, the temperature of the hot plate 58 is also detected by the high precision sensor S12 in order to detect an accurate temperature of the hot plate 58.

Then, comparison is made among the temperature ($T_{10}$) detected by the general purpose sensor S11 during the trial operation, the temperature ($T_{20}$) detected by the high precision sensor S12 during the trial operation, the temperature ($T_{11}$) at the present time detected by the general purpose sensor S11, and the temperature ($T_{21}$) at the present time detected by the high precision sensor S12. The site at which an abnormality has taken place can be specified by comparing these four temperatures. For example, where $T_{10}=T_{11}$ and $T_{20}=T_{21}$, there is no abnormality in any of the hot plate 58 and the general purpose sensor S11 and, thus, it is possible to judge that the temperature deviation has been caused by an abnormality present in the signal transmitting system such as the analog circuit 141 or the amplifier 143.

Also, where $T_{20} \neq T_{21}$, it is possible to judge that an abnormality resides in the heating system such as the heater 91 or the heating medium of the hot plate 58.

Further, where $T_{20}=T_{21}$ and $T_{10} \neq T_{11}$, the temperature itself of the hot plate 58 is the same and, thus, it is reasonable to understand that the temperature deviation has been caused by the deterioration of the general purpose sensor S11. Likewise, where $T_{20} \neq T_{21}$ and $T_{10}=T_{11}$, the detected value of the general purpose sensor S11 does not correspond to the temperature change of the hot plate 58 and, thus, it is reasonable to understand that the temperature deviation has been caused by the deterioration of the general purpose sensor S11.

On the other hand, where $T_{10} \neq T_{11}$ and $T_{20} \neq T_{21}$, it is reasonable to understand that there is an abnormality in another portion in addition to the abnormality in the hot plate 58, making it necessary to conduct a further survey.

Where $T_{10}=T_{11}$ and $T_{20}=T_{21}$, the controller 120 judges that there is no abnormality in any of the hot plate 58 and the general purpose sensor S11, and also judges that there is an abnormality in the signal transmitting system such as the analog circuit 141 or the amplifier 143.

In this case, the controller 120 judges whether the temperature deviation is of such a nature that the heat treating apparatus can be operated without difficulty by offsetting the temperature deviation by adjusting the analog circuit 141 or the amplifier 143. Where the difficulty can be dealt with sufficiently by adjusting the parameters, the display device 130 displays a message to that effect and the driver 140 is operated so as to adjust the parameters.

Incidentally, it is possible to arrange a circuit for investigating the operating state of the elements on the analog circuit 141 and the amplifier 143 separately from the driver 140. When it is judged as a result of comparison of the detected temperatures that there is an abnormality in the signal transmitting system, the element or the portion where the abnormality has taken place can be specified by using the particular circuit noted above.

On the other hand, where it is judged that the deterioration is so serious that the apparatus cannot be operated by adjusting the parameters of the analog circuit 141 and the amplifier 143 even under the condition of $T_{10}=T_{11}$ and $T_{20}=T_{21}$, the display device displays to that effect and warning is issued that it is necessary to replace the temperature sensor S11. Where $T_{20} \neq T_{21}$ and $T_{10}=T_{11}$, the apparatus is operated as in the case where $T_{20}=T_{21}$ and $T_{10} \neq T_{11}$.

Where $T_{10} \neq T_{11}$ and $T_{20} \neq T_{21}$, it is judged that there is another abnormality in addition to the abnormality in the hot plate 58. Since abnormality resides in a plurality of portions, it is displayed in the display device 140 that it is necessary to investigate the apparatus in detail.

As described above, in the heat treating apparatus of this embodiment, the temperature of the hot plate 58 is detected by using two systems including the standard general purpose sensor S11 and the high precision sensor 12, and the temperature ($T_{10}$ and $T_{20}$) of the hot plate 58 under the normal state are detected in a trial operation conducted soon after installation of the apparatus so as to store the detected temperature in a memory. At the same time, various parameters for maintaining the particular state such as the power supply rate to the heater and the gas flow rate into the hot plate are also stored in the memory so as to make it possible to reproduce the state in the step of the trial operation.

Where a temperature deviation has taken place between the target temperature of the hot plate 58 and the temperature detected by the general purpose sensor S11 six months to one year after installation of the apparatus, the temperature of the hot plate 58 at the present time is measured by both the general purpose sensor S11 and the high precision sensor S12 to obtain temperatures ($T_{11}$, $T_{21}$). Since the deterioration of the general purpose sensor S11 can be confirmed by the comparison between the temperature ($T_{10}$, $T_{20}$) at the time of the trial operation and the present temperature ($T_{11}$, $T_{21}$), it is possible to specify the portion where an abnormality resides.

It should also be noted that the heat treating apparatus of the present invention is equipped with a mechanism for electrically offsetting the temperature deviation by adjusting the analog circuit 141 and the amplifier 143. It follows that, where the apparatus can be operated smoothly by the electric adjustment, it is possible to recognize the fact of the temperature deviation, to specify the cause of the temperature deviation and to adjust again the temperature while the apparatus is kept operated.

In this embodiment, it is also possible to use a hot plate having a nichrome wire heater 91 embedded therein.

Also, in the embodiment described above, the general purpose sensor S11 and the high precision sensor 12 are used in combination to provide a temperature detection means. However, it is possible to use the general purpose sensor S11 alone as the temperature detection means. In this case, where a temperature deviation has taken place in the temperature sensor S11, the power supply rate and the gas blow rate during the normal operation are reproduced. Under this state, the temperature of the hot plate 58 is detected by the general purpose sensor S11 and is compared with the detected value, which is stored in the memory, during the normal operation so as to judge whether or not the general purpose sensor S11 is deteriorated. Even in this case, it is desirable to use the high precision sensor S12 in the form of an external apparatus so as to detect the temperature of the hot plate 58 by the two systems consisting of the general purpose sensor S11 and the high precision sensor S12 under the state that the power supply rate and the gas blow rate during the normal operation are reproduced.

It is possible to make the high precision sensor S12 detachable so as to use the sensor S12 only when required.

In the embodiment described above, the technical idea of the present invention is applied to a baking unit in which the hot plate 58 is used as a heating means. However, the technical idea of the present invention can also be applied to a cooling unit.

Figure 20:
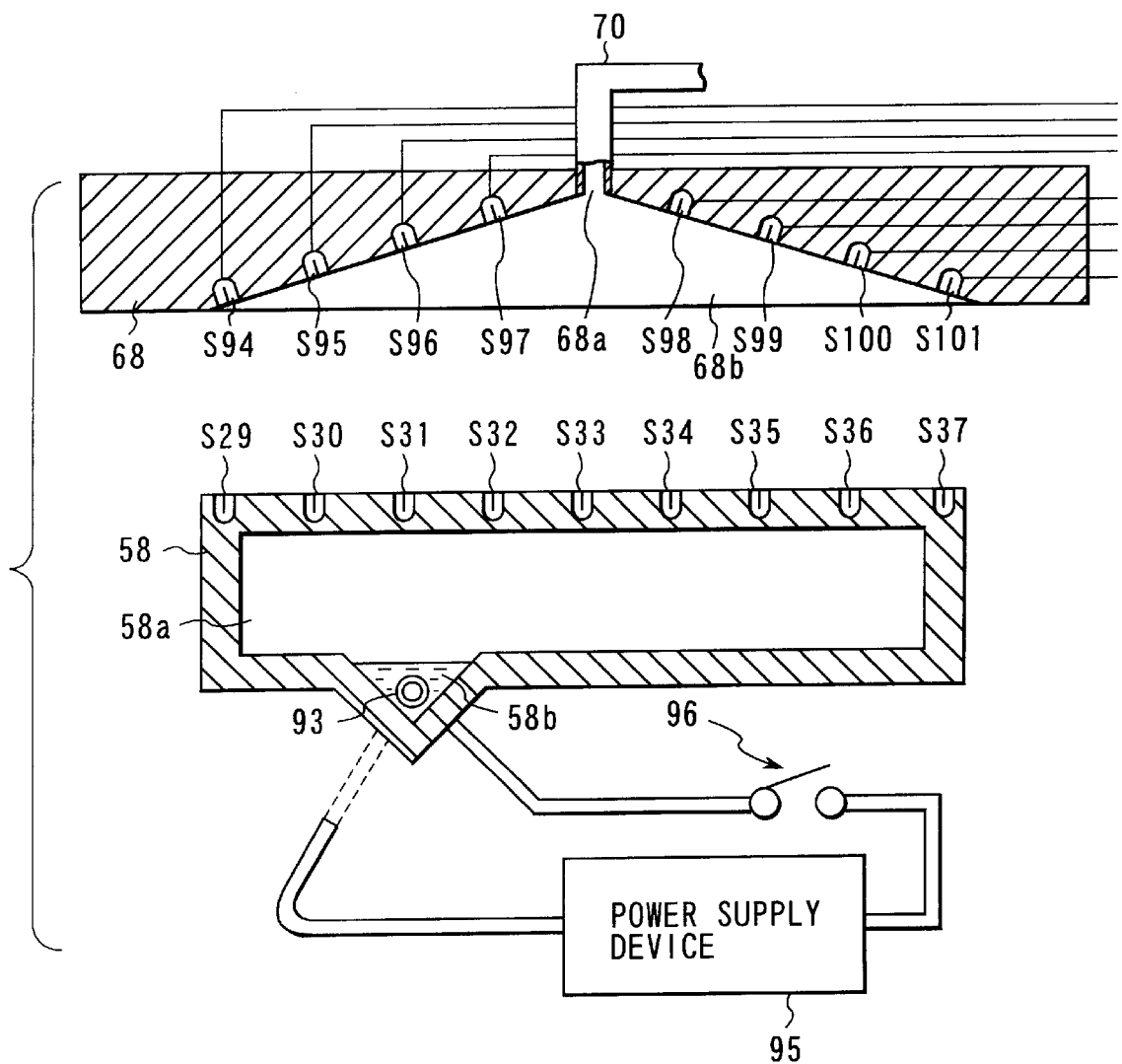
FIG. 20 is a vertical cross sectional view showing a heat treating apparatus according to another embodiment of the present invention.
Figure 21:
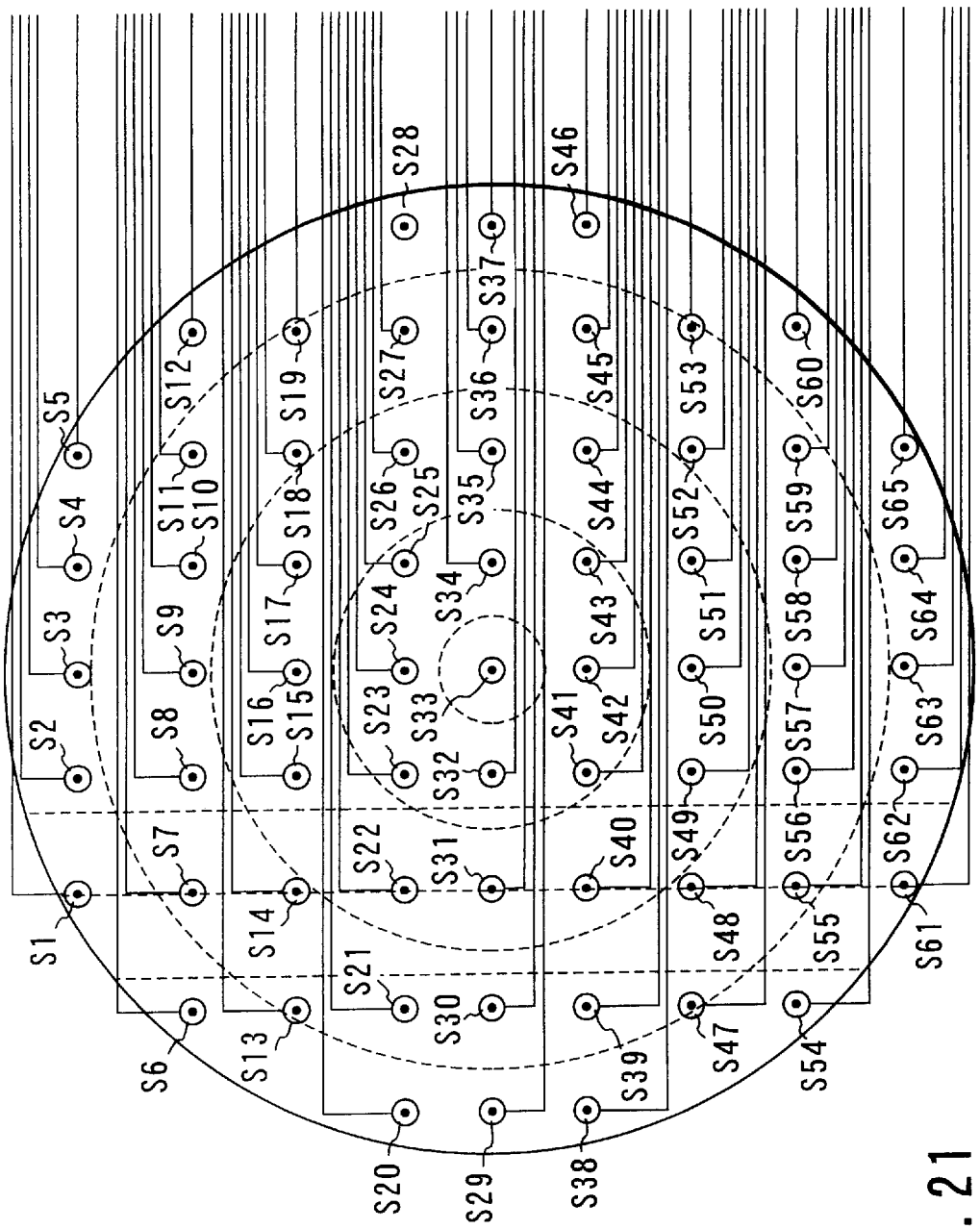
FIG. 21 is a plan view schematically showing a hot plate having temperature sensors mounted thereto.

As shown in FIGS. 20 and 21, a plurality of holes, e.g., 65 holes are formed in an upper surface region of the hot plate 58 such that these holes are arranged to form a matrix. Thermocouple type sensors S1 to S65 are arranged within these holes, respectively. These thermocouple type sensors S1 to S65 are lower sensors and are substantially equal to each other in temperature characteristics because these sensors are manufactured by a single lot. Each of these sensors S1 to S65 is connected to the controller 120.

Figure 22:
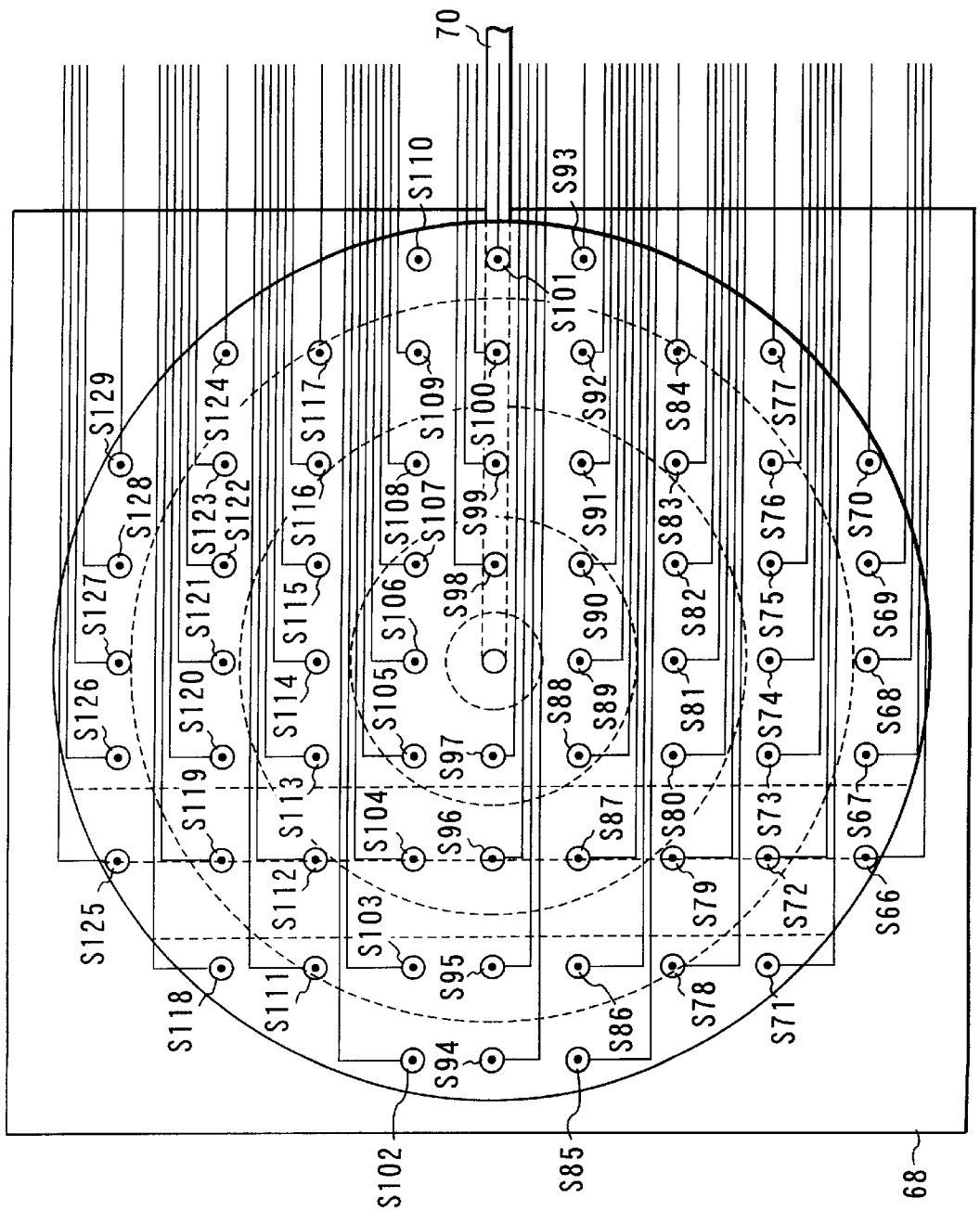
FIG. 22 a plan view, as viewed from below, showing an upper cover having temperature sensors mounted thereto.

FIG. 22 is a plan view showing the lower surface as viewed from below of an upper cover 68. As shown in the drawing, a plurality of temperature sensors, e.g., 64 temperature sensors S66 to S129, are formed in a matrix arrangement in a lower surface region of the upper cover 68. These sensors are arranged as upper sensors. These upper sensors S65 to S129 are arranged to face the lower sensors S1 to S65, respectively. For example, the upper sensor S66 is positioned right above the lower sensor S1. Also, the upper sensor S67 is positioned right above the lower sensor S2. In short, these upper and lower sensors are arranged to detect the temperature on the upper and lower surfaces at the same positions of the wafer W placed on the hot plate 58. Each of these upper sensors S66 to S129 is connected to the controller 120.

Figure 23:
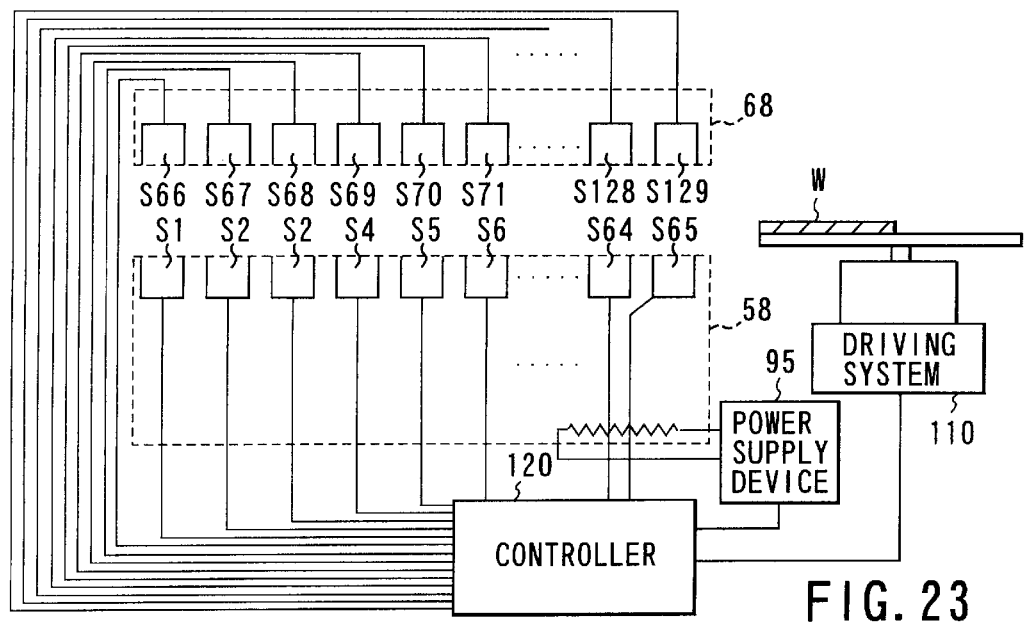
FIG. 23 is a block circuit diagram of a heat treating apparatus according to another embodiment of the present invention.

As shown in FIG. 23, each of the lower sensors S1 to S65, the upper sensors S66 to S129, and the power supply device 95 for supplying an electric power to the heater 93 arranged within the hot plate 58 is connected to the controller 120.

In the heat treating apparatus of the construction described above, the temperature is controlled as follows.

In the heat treating apparatus of this embodiment, the temperature at a plurality of points on the upper and lower surfaces of the wafer W is detected in place of detecting directly the wafer temperature, and the wafer temperature is estimated from the detected temperatures.

To be more specific, a plurality of temperature sensors S1 to S65 (lower temperature sensors) are arranged in an upper surface region of the hot plate 58. Likewise, a plurality of temperature sensors S66 to S129 (upper temperature sensors) are arranged in a lower surface region of the upper cover covering the upper portion of the hot plate 58. The temperature in the vicinity of the upper and lower surface of the wafer W is measured by these temperature sensors at a plurality of measuring points.

On the other hand, a modeling wafer W is prepared, and temperature sensors are arranged in several points of the modeling wafer W, e.g., at the portion sandwiched between the upper temperature sensor S1 and the lower temperature sensor S66. The particular modeling wafer W is placed on the hot plate 58 so as to apply a heat treatment to the modeling wafer W. While measuring the actual temperature in various points of the wafer W, the temperatures in the upper and lower portions are detected by the upper temperature sensors and the lower temperature sensors. Further, the relationship between the actual temperatures at various points of the wafer W and the temperatures detected at each point by the upper sensors and the lower sensors is examined in advance and stored in the memory of the controller 120. In this case, the temperature very close to the actual temperature of the wafer W can be estimated by detecting the temperatures in the vicinity of the wafer by the upper temperature sensors and the lower temperature sensors, even if the actual temperature of the wafer W is not measured.

Likewise, the relationship between the actual temperature of the wafer W and the temperatures detected by the upper temperature sensors and the lower temperature sensors is examined in advance and is stored in the memory of the controller 120 in respect of various points including the point interposed between the upper temperature sensor S2 and the lower temperature sensor S67. If the relationship between the temperature of the wafer W and the temperature in the vicinity of the wafer W in various points is stored as data base, the actual temperature of the wafer W can be estimated considerably accurately by only the indirect temperature measurement using the upper temperature sensors and the lower temperature sensors.

Figure 24A:
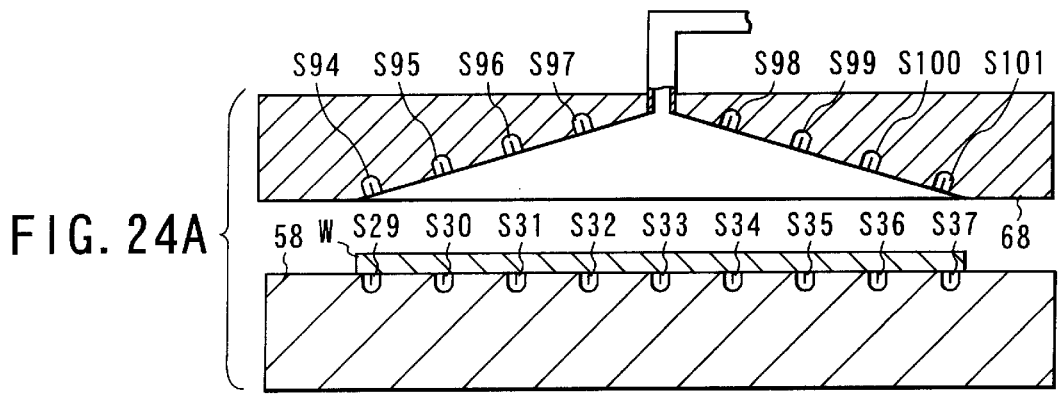
FIG. 24A is a cross sectional view schematically showing a hot plate having temperature sensors mounted thereto and a cover having other temperature sensors mounted thereto.
Figure 24B:
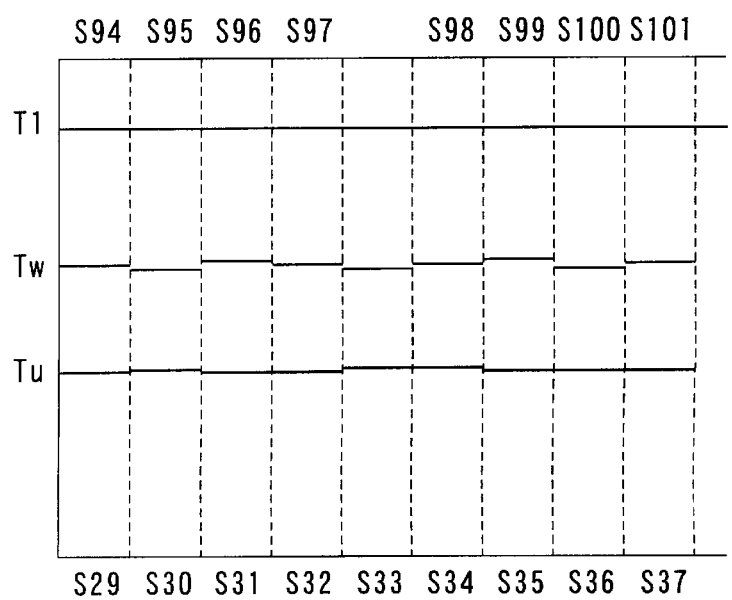
FIG. 24B shows the temperature characteristics of a heat treating apparatus according to another embodiment of the present invention.

FIG. 24B is a graph showing the relationship between the temperature of the wafer itself and the temperature in the vicinity of the wafer W. Line Tw shown in the graph denotes the actual distribution the temperatures measured at various points of the wafer W. Line Tu in the graph denotes the distribution of temperatures measured by the upper temperature sensors at points right above the wafer W. Further, line T1 in the graph denotes the distribution of temperature T1 detected by the lower temperature sensors at points corresponding to various points of the wafer W. As apparent from the graph, there is a certain relationship among Tw, Tu and T1. It follows that it is possible to estimate easily the value of Tw, if the temperatures Tu and T1 are known.

The accuracy of estimation is improved with increase in the number of temperature measurements of the modeling wafers W. Naturally, it is desirable to use a large number of modeling wafers w for preparation of the data base.

How to control the temperature will now be described in respect of the case where the heat treating unit of this embodiment is used for the heat treatment.

In the heat treating unit of this embodiment, whether the wafer W is warped and the degree of warping, if the wafer W is warped, is determined on the basis of the temperature distribution in the vicinity of the upper and lower surfaces of the wafer W that are detected by the temperature sensors arranged in an upper surface region of the hot plate 58 and in a lower surface region of the upper cover. Also, where the degree of warping falls within an allowable range, the temperature of the hot plate is controlled at the target temperature. On the other hand, where the degree of warping of the wafer W falls outside the allowable range, the target temperature for controlling the hot plate 58 is adjusted appropriately to conform with the degree of warping of the wafer W.

Let us describe the case where the wafer W free from warping is subjected to a heat treatment on the hot plate 58 with reference to FIGS. 24A, 24B, 10A, 10B and 10C. The following description covers the case of using the lower temperature sensors S29 to S37 and the upper temperature sensors S94 to S101 as representatives. Of course, the other temperature sensors S1 to S28, S38 to S65, S69 to S93 and S102 to S129 also perform the same function.

If the wafer W free from warping is placed on the hot plate 28 as shown in FIG. 24A, the surface temperature of the hot plate 58 is rapidly lowered in a short time (time t4 to time t5), as seen from curve A shown in FIG. 10B. In this step, the temperature on the surface of the hot plate 58 and in the vicinity of the lower surface of the upper cover 68 were detected by the lower temperature sensors S29 to S37 and the upper temperature sensors S94 to S101 so as to obtain a temperature distribution as shown in FIG. 24B. Incidentally, the actual temperature Tw of the wafer W was measured by directly mounting a temperature sensor to a modeling wafer. As apparent from FIG. 10B, the actual temperature Tw of the wafer W is lower than the surface temperature T1 of the hot plate 58 immediately after placement of the wafer W on the hot plate 58. Also, the temperature Tu on the lower surface of the upper cover 68 is further lower than the actual temperature Tw of the wafer.

As apparent from FIG. 24B, each of the temperatures Tw, T1 and Tu is small in variation where the wafer W is not warped. If the distribution of these temperatures T1 and Tu is uniform as shown in FIG. 24B, the distribution of the temperature Tw is also rendered uniform, making it possible to estimate that the wafer W is not warped. Where the temperature distribution of each of the hot plate 58 and the upper cover 68 is substantially uniform, the controller 120 judges that the wafer W is not warped so as to control the power supply to the heater power source and, thus, to set the hot plate 58 at the first target temperature θa (T1 to T2), as shown in FIG. 10C.

Then, let us describe the case where a warped wafer W is subjected to a heat treatment on the hot plate 58 with reference to FIGS. 25A, 25B, 12A, 12B and 12C.

Figure 25A:
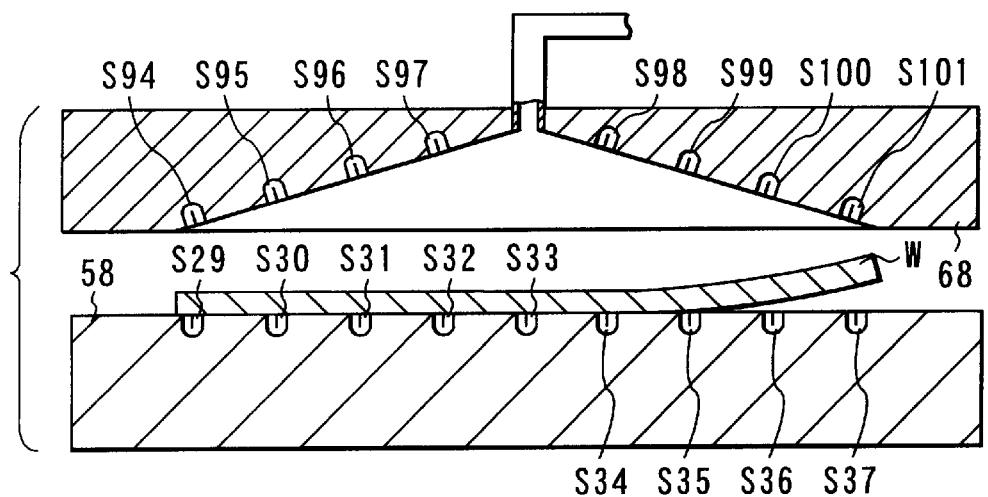
FIG. 25A is a cross sectional view schematically showing a hot plate having temperature sensors mounted thereto and a cover having other temperature sensors mounted thereto.
Figure 25B:
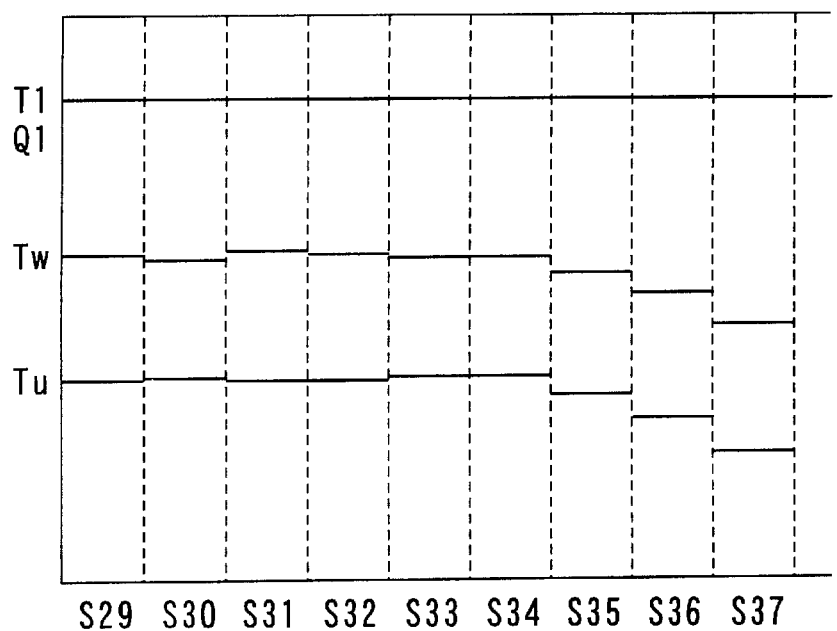
FIG. 25B shows the temperature characteristics of a heat treating apparatus according to another embodiment of the present invention.

If a warped wafer W is disposed on the hot plate 58 as shown in FIG. 25A, the wafer W is brought into contact with the hot plate 58 in only the portions where the temperature sensors S29 to S33 are arranged, with the other portion of the wafer W positioned away from the hot plate 58. In this case, the controller 120 detects the non-uniform temperature in the vicinity of the wafer W based on the temperature detection signal supplied from the temperature sensors S94 to S101. Where the non-uniformity of the temperature falls within an allowable range, the controller 120 controls the surface temperature of the hot plate 58 at the first target temperature θa (T1 to T2). On the other hand, where the non-uniformity of the temperature exceeds the allowable range, the controller 120 performs switching from the first target temperature θa (T1 to T2) to the second target temperature θa' (T3 to T4) and controls the surface temperature of the hot plate 58 at the first target temperature θa (T1 to T2). The allowable range of the temperature difference in this case is ±3×σ of the average value, where σ denotes the standard deviation. 99.7% of the entire data falls within the allowable range thus defined. The second target temperature θa' (T3 to T4) is set in accordance with the degree of warping of the wafer W. These first target temperature θa (T1 to T2) and the second target temperature θa' (T3 to T4) are stored as data base in the memory of the controller 120.

Let us describe the case where a resist film of the wafer W is baked by using the heat treating apparatus of this embodiment.

The main transfer arm mechanism 22 takes a wafer W out of the resist coating unit (COT) and transfers the wafer W into the pre-baking unit (PREBAKE). Then, the wafer W is placed on the hot plate 58 within the pre-baking unit (PREBAKE).

On the other hand, an electric power is supplied from the power supply device 95 to the heater 93 when the power source of the pre-baking unit (PREBAKE) is turned on. As a result, the temperature of the hot plate 58 is set at the first target temperature θa (T1 to T2). Also, the controller 120 controls the temperature of the hot plate 58 based on the temperature detected by the lower temperature sensors S1 to S65. When the temperature of the hot plate 58 is stabilized at the first target temperature θa (T1 to T2), the main transfer arm mechanism 22 places the wafer W on the hot plate 58.

The temperature in the vicinity of the wafer W is detected by the lower temperature sensors S1 to S65 and the upper temperature sensors S66 to S129. Based on the temperature detected by these temperature sensors, the controller 120 estimates the temperature of the wafer W. Then, the temperature of the hot plate 58 is controlled on the basis of the estimated temperature of the wafer W.

Further, the controller 120 judges whether the wafer W placed on the hot plate 58 is warped and the degree of warping, if the wafer W is warped, on the basis of the temperature detected by the temperature sensors S1 to S65 and S66 to S 129. Where the wafer W is judged not to be warped, the controller 120 controls the temperature of the hot plate 58 at the first target temperature θa (T1 to T2).

The first target temperature θa (T1 to T2) represents the target temperature at which the wafer W is heated in an ideal manner in the case where the wafer W free from warping is placed on the hot plate 58. It follows that the temperature of the hot plate 58, which is rapidly lowered immediately after placement of the wafer W on the hot plate 58 as shown in FIG. 10B, is elevated to reach the first target temperature θa (T1 to T2) by the heat energy supplied from the heater 93.

On the other hand, where the wafer W is judged to be warped, the controller 120 determines the degree of warping of the wafer W based on the temperature detected by the temperature sensors S1 to S65 and S66 to S129. Then, a target temperature most adapted for effectively utilizing that portion of the wafer which is not warped is determined from among the data base. For example, the second target temperature θa' (T3 to T4) is selected as the optimum target temperature, and the temperature of the hot plate 58 is controlled at the second target temperature θa' (T3 to T4).

Let us describe the case where the temperature of the hot plate 58 is controlled by using the second target temperature θa' (T3 to T4) with reference to FIGS. 12A, 12B and 12C.

As shown in FIG. 12B, the heater power source 95 is not turned on until the temperature of the hot plate 58 after placement of the wafer W thereon downwardly exceeds T4. Therefore, the temperature history (curve B) in the case of using the second target temperature θa' (T3 to T4) is on the lower temperature side, compared with the temperature history (curve A) in the case of using the first target temperature θa (T1 to T2). What should be noted is that the warped wafer W is partially brought into contact with the hot plate 58, with the result that the heat released from the hot plate 58 to the wafer W is smaller than that in the case of using the wafer W that is not warped. Therefore, while the warped wafer W is placed on the hot plate 58, the temperature of the hot plate 58 is controlled at a relatively low second target temperature θa' (T3 to T4). It should be noted that the second target temperature θa' (T3 to T4) is adapted for applying an ideal heat treatment to that portion of the wafer W which is not warped in the case of placing a warped wafer W on the hot plate 58.

It should be noted that curve A of a dotted line shown in FIG. 12B denotes the change in temperature of the hot plate 58 in the case where the temperature of the wafer W that is not warped is controlled at the first target temperature θa. On the other hand, a curve C of a dot-and-dash line denotes the change in temperature of the hot plate 58 in the case where the temperature of a warped wafer W is controlled at the first target temperature θa. As apparent from FIG. 12B, the temperature of the hot plate 58 is held lower in the case of the control at the second target temperature θa' (T3 to T4) than in the case of the control at the first target temperature θa (T1 to T2).

Incidentally, in order to estimate the present temperature of the wafer W, the actual temperatures at each point and peripheral portion of the wafer W are measured, and the temperature correlation data are stored in a memory of the controller 120. When temperature detection signals are supplied from the upper temperature sensors and the lower temperature sensors to the controller 120, the CPU reads out the temperature correlation data from the memory of the controller 120, and the present temperature at each point of the wafer W is estimated on the basis of the temperature correlation data thus read out and the temperature detection signals. The estimated temperature thus obtained is highly accurate.

As described above, in the heat treating apparatus of the embodiment described above, the temperatures in the vicinity of the wafer W are detected by using the lower temperature sensors S1 to S65 and the upper temperature sensors S66 to S129. The present temperature of the wafer W placed on the hot plate 58 is estimated on the basis of these detected temperatures, and the temperature of the hot plate 58 is fed back by using the estimated temperature. The particular technique of the present invention makes it possible to bring the temperature of the hot plate 58 to the set target temperature promptly, with the result that the wafer W is subjected to a heat treatment appropriately.

Also, in the heat treating apparatus of the embodiment described above, whether or not the wafer W is warped and the degree of warping, if the wafer W is warped, can be detected on the basis of the temperatures detected by the lower temperatures sensors S1 to S64 and the upper temperature sensors S65 to S129, making it possible to switch the target temperature of the hot plate 58 based on the state of the wafer W. It follows that an appropriate heat treatment can be applied to even a warped substrate W.

Whether or not the wafer W is warped and the degree of warping, if the wafer W is warped, can be detected as follows. Specifically, if a warped substrate W is placed on the hot plate 58, a non-uniform clearance is formed between the wafer W and the hot plate 58. In the portion where the clearance is large, the temperature of the hot plate 58 is not sufficiently lowered because heat is not efficiently transmitted from the hot plate 58 to the wafer W. On the other hand, in the portion where the clearance is small, the temperature of the hot plate 58 is rapidly lowered because heat is efficiently transmitted from the hot plate 58 to the wafer W. It follows that whether or not the wafer W is warped and the degree of warping, if the wafer W is warped, can be detected by analyzing in detail the change in temperature in each point of the hot plate 58 before and after the wafer W is placed on the hot plate 58.

The arrangement of the upper and lower temperature sensors is not limited to a lattice-like arrangement. Alternatively, these temperature sensors may be arranged to form, for example, a concentric configuration, a radial configuration, a triangular configuration or a hexagonal configuration.

In the present invention, the hot plate on which a substrate is not placed is forcedly cooled by a forcedly cooling means so as to intentionally increase the heat supply rate to the hot plate. As a result, the temperature of the hot plate that is lowered after placement of the substrate can be restored promptly to a target temperature.

Also, in the present invention, a dummy signal is transmitted from a dummy signal transmitter to the controller during the period between the time when the preceding substrate is removed from the hot plate and the time when the succeeding substrate is placed on the hot plate. As a result, the controller imaginarily recognizes that the temperature of the hot plate was lowered so as to increase the power supply rate to the heater. It follows that the temperature of the hot plate that is lowered after placement of the substrate on the hot plate is rapidly recovered to the target temperature θa.

What should also be noted is that, in the present invention, a gas is blown against the mounting position of the temperature sensor so as to locally cool the mounting position. As a result, a detection signal of temperature that is lower than the actual temperature is supplied to the controller so as to increase the power supply rate to the heater. Even where the local gas blowing is stopped and the succeeding substrate is placed on the hot plate, the temperature of the hot plate is rapidly recovered to the target temperature because heat energy is excessively supplied originally to the other portion of the hot plate (temperature sensors).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat treating apparatus, comprising:
    a hot plate having a top surface on which is placed a substrate that is to be subjected to a heat treatment;
    setting means for setting an original target temperature of said hot plate required for subjecting said substrate to a heat treatment;
    a heat energy supply source for supplying a heat energy to said hot plate;
    temperature detecting means for detecting the temperature of the hot plate; and
    control means receiving a detection signal from said temperature detecting means to obtain a difference in the detected temperature of the hot plate between the state that the substrate is not placed on the hot plate and the state that the substrate is placed on the hot plate, said original target temperature being switched based on said difference, and a signal denoting said switched target temperature in place of said original target temperature being supplied from said control means to said heat energy supply source.

2. A heat treating apparatus according to claim 1, wherein said temperature detecting means includes a plurality of temperature sensors for detecting temperatures at different portions of the hot plate, said temperature sensors being arranged to form a row on the top surface of the hot plate along the diameter of the hot plate.

3. A heat treating apparatus according to claim 1, wherein said temperature detecting means includes a plurality of temperature sensors for detecting temperatures at different portions on the top surface of the hot plate, said temperature sensors being arranged in symmetry with respect to axis of the hot plate.

4. A heat treating apparatus according to claim 1, wherein said hot plate includes a hollow portion and a liquid reservoir portion communicating with said hollow portion, and said heat energy supply source includes a liquid heating medium stored in said liquid reservoir portion, a resistance heater dipped in said heating medium, and a power supply device for supplying an electric power to said resistance heater,
    wherein, if the control means transmits a power supply signal to said power supply device, an electric power is supplied from the power supply device to the resistance heater so as to permit the resistance heater to generate heat, thereby to evaporate the heating medium within the liquid reservoir portion to generate a vapor, said vapor filling the hollow portion so as to impart a heat energy to the hot plate.

5. A heat treating apparatus according to claim 1, further comprising a substrate transfer mechanism for transferring substrates one by one for placing the transferred substrate on the hot plate.

6. A heat treating apparatus, comprising:
    a hot plate having a top surface on which is placed a substrate that is to be subjected to a heat treatment;
    setting means for setting an original target temperature of said hot plate required for subjecting said substrate to a heat treatment;
    a heat energy supply means for supplying a heat energy to said hot plate;
    warping deformation detecting means for detecting the warping deformation of the substrate on the hot plate; and
    control means receiving a detection signal from said warping deformation detecting means, said original target temperature being switched based on said detection signal, and a signal denoting said switched target temperature in place of said original target temperature being supplied from said control means to said heat energy supply source.

7. A heat treating apparatus according to claim 6, wherein said warping deformation detecting means consists of a plurality of pressure sensors for detecting the pushing force applied from the substrate to the top surface of the hot plate.

8. A heat treating apparatus according to claim 6, wherein said warping deformation detecting means consists of a plurality of distance sensors for detecting the distance between the top surface of the hot plate and the substrate.

9. A heat treating apparatus according to claim 6, wherein said hot plate includes a hollow portion and a liquid reservoir portion communicating with said hollow portion, and said heat energy supply source includes a liquid heating medium stored in said liquid reservoir portion, a resistance heater dipped in said heating medium, and a power supply device for supplying an electric power to said resistance heater, wherein, if the control means transmits a power supply signal to said power supply device, an electric power is supplied from the power supply device to the resistance heater so as to permit the resistance heater to generate heat, thereby to evaporate the heating medium within the liquid reservoir portion to generate a vapor, said vapor filling the hollow portion so as to impart a heat energy to the hot plate.

10. A heat treating apparatus according to claim 6, further comprising a transfer mechanism for transferring substrates one by one for placing the transferred substrate on the hot plate.

11. A heat treating apparatus, comprising:

a hot plate having a top surface on which is placed a substrate that is to be subjected to a heat treatment;

setting means for setting an original target temperature of said hot plate required for subjecting said substrate to a heat treatment and an allowable range of said original target temperature;

a heat energy source for supplying a heat energy to said hot plate;

temperature detecting means for detecting the temperature of the hot plate;

temperature control means receiving a detection signal from said temperature detecting means and controlling said heat energy supply means based on said detection signal so as to maintain the temperature of the hot plate within an allowable range of said original target temperature;

transfer means for transferring substrates one by one onto said hot plate; and cooling mechanism for forcedly cooling the hot plate during the period between removal of the heat-treated substrate from the hot plate and placement of the succeeding substrate on the hot plate.

12. A heat treating apparatus according to claim 11, wherein said forcedly cooling mechanism includes a gas nozzle for blowing a gas against the top surface of the hot plate.

13. A heat treating apparatus according to claim 12, wherein said temperature detecting means includes temperature sensors buried right below the top surface of the hot plate, and said gas nozzle blows a gas against the top surface of the hot plate in which said temperature sensors are buried.

14. A heat treating apparatus according to claim 11, wherein said forcedly cooling mechanism includes a thermoelectric cooling element arranged to be capable of heat exchange with the hot plate.

15. A heat treating apparatus according to claim 11, wherein said forcedly cooling mechanism includes a cooling water circulating mechanism arranged to be capable of heat exchange with the hot plate.

16. A heat treating apparatus according to claim 11, wherein said forcedly cooling means is a dummy signal transmitter for transmitting a dummy signal to said temperature control means for rapidly bringing the temperature of the hot plate to said original target temperature.

17. A heat treating apparatus according to claim 12, wherein said forcedly cooling means includes:

a gas supply mechanism for supplying a gas sideways of the hot plate such that the supplied gas flows in a direction substantially parallel to the top surface of the hot plate; and means for increasing the gas supply rate from said gas supply mechanism during the period between removal of the treated substrate and placement of the succeeding substrate on the hot plate.

18. A heat treating apparatus according to claim 17, wherein said gas supply rate increasing means is a flow rate control valve mounted to the supply circuit of the gas supply mechanism.

19. A heat treating apparatus, comprising:

a hot plate having a top surface on which is placed a substrate that is to be subjected to a heat treatment;

a heater arranged in said hot plate;

a temperature sensor arranged in said hot plate;

an interrupter for turning said heater on or off based on the temperature detected by the temperature sensor;

a transfer mechanism for transferring substrates one by one onto said hot plate;

a nozzle having a spurting port facing said temperature sensor;

a gas supply mechanism for supplying a gas to said nozzle; and control means for operating said gas supply means during the period between removal of the heat-treated substrate from said hot plate and placement of the succeeding substrate on the hot plate so as to permit a gas to be spurted from said nozzle toward the temperature sensor.

20. A heat treating apparatus, comprising:

a hot plate having a top surface on which is placed a substrate that is to be subjected to a heat treatment;

a heater arranged in said hot plate;

a temperature sensor arranged in said hot plate;

setting means for setting a target temperature of the hot plate required for subjecting the substrate to a heat treatment;

control means for obtaining a difference between the temperature detected by the temperature sensor and said target temperature and for controlling the temperature of the hot plate by adjusting the heater to eliminate said difference;

memory means for storing the detected temperature and the thermal environment of the hot plate during the normal operation; and means for reading the thermal environment from said memory means when a temperature deviation has taken place between the target temperature and the detected temperature, for reproducing the thermal environment, and for specifying the degree of said temperature deviation and the point where the temperature deviation has taken place based on the reproduced thermal environment and the detected temperature of the hot plate during the normal operation.

21. A heat treating apparatus according to claim 20, further comprising means for actuating said control means to eliminate the temperature deviation in accordance with the specified degree of temperature deviation and the specified point where the temperature deviation has taken place.

22. A heat treating apparatus, comprising:
a hot plate having a top surface on which is placed a substrate that is to be subjected to a heat treatment;
a heater arranged in said hot plate;
a power supply mechanism for supplying an electric power to said heater;
a gas supply mechanism for supplying a gas from sideways of the hot plate toward the hot plate;
a temperature sensor for detecting the temperature of the hot plate;
setting means for setting a target temperature of the hot plate required for subjecting the substrate to a heat treatment;
control means for obtaining a difference between the temperature detected by said temperature sensor and said target temperature and for controlling the power supply mechanism to eliminate said difference;
memory means for storing the amount of an electric power supplied from said power supply mechanism to the hot plate during the normal operation, a gas flow rate supplied from said gas supply mechanism during the normal operation, and the temperature detected by said temperature sensor during the normal operation; and
means for reading the power supply amount and the gas flow rate from said memory means when a temperature deviation has taken place between the target temperature and the detected temperature, for operating the power supply mechanism and the gas supply mechanism based on the power supply amount and the gas flow rate read out of the memory means and allowing the temperature sensor to detect the temperature of the hot plate, and for specifying the degree of the temperature deviation and the point where the temperature deviation has taken place based on the detected temperature and the temperature detected during the normal operation.

23. A heat treating apparatus according to claim 22, further comprising means for actuating said control means to eliminate the temperature deviation in accordance with the specified degree of temperature deviation and the specified point where the temperature deviation has taken place.

24. A heat treating apparatus, comprising:
a hot plate having a top surface on which is placed a substrate that is to be subjected to a heat treatment;
a heater arranged in said hot plate;
a power supply mechanism for supplying an electric power to said heater;
a gas supply mechanism for supplying a gas from sideways of the hot plate toward the hot plate;
setting means for setting a target temperature of the hot plate required for subjecting the substrate to a heat treatment;
a first sensor for detecting the temperature of the hot plate, said detected temperature being converted into an electric signal;
an analog circuit for amplifying said electric signal;
control means for controlling the power supply rate of the power supply mechanism based on the amplified electric signal so as to set the temperature of the hot plate at said target temperature;
a second sensor for detecting the temperature of the hot plate at an accuracy higher than that in said first sensor;
memory means for storing the power supply rate from said power supply mechanism to said hot plate during the normal operation, the gas flow rate from said gas supply mechanism during the normal operation, the temperature detected by said first sensor during the normal operation, and the temperature detected by said second sensor during the normal operation; and
means for reading the power supply rate and the gas flow rate out of said memory means when a temperature deviation has taken place between the target temperature and the temperature detected by the first sensor, for operating the power supply mechanism and the gas supply mechanism based on the power supply rate and the gas flow rate, respectively, read out of the memory means, and allowing the first and second sensors to detect the temperature of the hot plate at this stage, and for specifying the degree of the temperature deviation and the point where the temperature deviation has taken place based on the detected temperature and the temperature detected during the normal operation.

25. A heat treating apparatus according to claim 24, further comprising means for actuating said analog circuit or said control means to eliminate the temperature deviation in accordance with the specified degree of temperature deviation and the specified point where the temperature deviation has taken place.

26. A heat treating apparatus according to claim 24, further comprising display means for displaying the point specified by said specifying means.

27. A heat treating apparatus according to claim 24, further comprising alarming means for issuing an alarm in the case where it is necessary to repair or replace the point specified by said specifying means.

28. A heat treating apparatus, comprising:
a hot plate having a top surface on which is placed a substrate that is to be subjected to a heat treatment;
setting means for setting a target temperature of the hot plate required for subjecting the substrate to a heat treatment and an allowable range of said target temperature;
a heat energy supply source for supplying a heat energy to said hot plate;
a plurality of first temperature sensors for detecting the temperatures at a plurality of points on the top surface of the hot plate;
a plurality of second temperature sensors for detecting temperatures at a plurality of points above the hot plate;
memory means for storing the actual temperature of the substrate, the actual temperature of the top surface of the hot plate, and the temperature correlation data denoting the relationship with the temperature above the hot plate, at the time when a heat energy is supplied from the heat energy supply source to the hot plate;
estimating means for receiving detection signals from the first and second temperature sensors, for reading the temperature correlation data from said memory means, and for estimating the present temperature of the hot plate based on the temperature correlation data and the signals detected by the first and second temperature sensors; and
control means for controlling the heat energy supply source based on the present temperature estimated by said estimating means.

29. A heat treating apparatus according to claim 28, further comprising an upper cover arranged above the hot plate to face the top surface of the hot plate and a plurality of second temperature sensors arranged in said upper cover.

30. A heat treating apparatus according to claim 29, wherein said plurality of first temperature sensors are concentrically arranged in the hot plate and said plurality of second temperature sensors are concentrically arranged in said upper cover.

31. A heat treating apparatus according to claim 29, wherein said plurality of first temperature sensors are arranged to form a lattice configuration in the hot plate and said plurality of second temperature sensors are arranged to form a lattice configuration in said upper cover.

32. A heat treating apparatus according to claim 28, wherein said setting means determines said target temperature based on the difference between the temperature detected by said first temperature sensor and the temperature detected by said second temperature sensor.

33. A heat treating apparatus according to claim 28, wherein said setting means determines said target temperature based on the temperature detected by said first temperature sensor before the substrate is placed on the hot plate and the temperature detected by the first temperature after the substrate is placed on the hot plate.

34. A heat treating apparatus according to claim 28, wherein said setting means determines said target temperature based on the temperature detected by said second temperature sensor before the substrate is placed on the hot plate and the temperature detected by the second temperature after the substrate is placed on the hot plate.

35. A heat treating apparatus according to claim 28, wherein said setting means determines as said target temperature any of the temperature of the hot plate that permits the substrate free from warping to be maintained at said target temperature and the temperature of the hot plate that permits the flat portion of the warped substrate to be maintained at the target temperature.

* * * * *

UNITED STATES PATENT AND TRADEMARK OFFICE
CERTIFICATE OF CORRECTION

PATENT NO.    : 6,191,394 B1
DATED         : February 20, 2001
INVENTOR(S)   : Shirakawa et al.

It is certified that error appears in the above-identified patent and that said Letters Patent is hereby corrected as shown below:

<u>Title page,</u>
Item [30], Foreign Application Priority Data should read:

-- [30]     Foreign Application Priority Data

| May 20, 1998 | (JP) | 10-138794 |
| May 20, 1998 | (JP) | 10-138795 |
| May 20, 1998 | (JP) | 10-138796 |
| May 29, 1998 | (JP) | 10-150363 -- |

Signed and Sealed this

Twenty-ninth Day of April, 2003

JAMES E. ROGAN
*Director of the United States Patent and Trademark Office*